United States Patent [19]
McCutcheon

[11] Patent Number: 5,958,556
[45] Date of Patent: Sep. 28, 1999

[54] VIBRATION DAMPED AND STIFFENED CIRCUIT ARTICLES

[75] Inventor: Jeffrey W. McCutcheon, Eagan, Minn.

[73] Assignee: Minnesota Mining and Manufacturing Company, St. Paul, Minn.

[21] Appl. No.: 08/769,987

[22] Filed: Dec. 19, 1996

[51] Int. Cl.$^6$ ..................................................... B32B 3/28
[52] U.S. Cl. .............................. 428/172; 428/71; 428/75; 428/99; 428/220; 428/416; 174/161 R
[58] Field of Search ..................... 428/209, 172, 428/220, 416, 71, 75, 99

[56] References Cited

U.S. PATENT DOCUMENTS

| | | | |
|---|---|---|---|
| 2,819,032 | 1/1958 | Detrie | 244/119 |
| 3,071,217 | 1/1963 | Gould | 189/34 |
| 3,078,969 | 2/1963 | Campbell | 189/37 |
| 3,159,249 | 12/1964 | Lazan | 189/34 |
| 3,160,549 | 12/1964 | Caldwell | 161/161 |
| 4,053,943 | 10/1977 | Galvin | 361/399 |
| 4,133,157 | 1/1979 | Bschorr et al. | 52/403 |
| 4,566,231 | 1/1986 | Konsevich | 52/145 |
| 4,988,577 | 1/1991 | Jamieson | 428/573 |
| 5,183,863 | 2/1993 | Nakamura | 525/438 |
| 5,262,232 | 11/1993 | Wilfong | 428/327 |
| 5,308,887 | 5/1994 | Ko | 522/148 |
| 5,557,503 | 9/1996 | Isaacs | 361/719 |

FOREIGN PATENT DOCUMENTS

WO92/21178 11/1992 WIPO.

OTHER PUBLICATIONS

*Proceedings of Damping '89, Feb. 8–10, 1989, West Palm Beach, Florida*, WL–TR–89–3116, vol. III, Nov. 1989, pp. JBC–1–JBC–24, Sponsored by: Flight Dynamics Laboratory of the Air Force, Wright Aeronautical Laboratories, Air Force Systems Command, Wright Patterson Air Force Base, Ohio 45433–6553.

*Proceedings of Damping '89, Feb. 8–10, 1989, West Palm Beach, Florida*, WL–TR–89–3116, vol. III, Nov. 1989, pp. JBD–1–JBD–18, Sponsored by: Flight Dynamics Laboratory of the Air Force, Wright Aeronautical Laboratories, Air Force Systems Command, Wright Patterson Air Force Base, Ohio 45433–6553.

*Proceedings of Damping '91, Feb. 13–15, 1991, San Diego, California*, WL–TR–91–13078, vol. II, Aug. 1991, pp. FAA–1–FAA–16, Sponsored by: Wright Laboratory, Flight Dynamics Directorate, Wright Aeronautical Laboratories, Air Force Systems Command, Wright Patterson Air Force Base, Ohio 45433–6553.

*Primary Examiner*—William Krynski
*Assistant Examiner*—Cathy F. Lam

[57] ABSTRACT

The present invention provides circuit articles which are damped and stiffened relative to resonant vibrations and shock. At least one vibration damping and stiffening member comprising a constraining member comprising a base having at least one projection and a layer(s) of vibration damping material is attached to the circuit article. These member(s) act to stiffen the circuit article and also add significant damping to the circuit article while potentially taking up only a relatively small circuit article surface area.

35 Claims, 9 Drawing Sheets

VIBRATION DAMPED AND STIFFENED CIRCUIT ARTICLES

FIELD OF THE INVENTION

The present invention relates to circuit articles which are damped and stiffened relative to resonant vibrations and shock. At least one vibration damping and stiffening member is attached to the circuit article. These member(s) act to stiffen the circuit article and also add significant damping to the circuit article while potentially taking up only a relatively small circuit article surface area.

BACKGROUND OF THE INVENTION

Periodic or random vibrations or shock can excite the resonant frequencies in circuit articles such as printed circuit boards, printed wire boards, flexible circuits, etc. For example, excited resonant frequencies in a circuit board can be problematic due to the resultant formation of undesirable stresses, displacements, fatigue, mechanical forces, and even sound radiation. Such undesirable vibrations or shocks are typically induced by external forces and can be experienced by a wide variety of circuit articles and under a variety of conditions. For example, printed circuit boards (PCBs) have the electrical traces laid-out upon or within a base substrate or laminate and typically have various components such as integrated circuit chips, resistors, capacitors, and the like, placed on and connected to these various electrical traces or other connection devices. Resonant vibrations can cause problems in circuit articles such as printed circuit boards and cards, etc., by significantly increasing the mechanical displacement of the base substrate or laminate, which may result in undesirable stresses and fatigue and subsequent premature circuit article failure. In addition, components which extend away from the surface of the circuit article can experience significant mechanical displacement due to the resonant vibrations in the circuit article thus potentially leading to mechanical damage of the components, premature failure of connection points and lower part reliability.

Various techniques have been used to reduce vibrational and shock amplitude effects on circuit articles, such as PCBs, with limited success.

A first known method involves the addition of flat, non-metallic, dampers to the exterior surface of the circuit article, i.e., "add-on dampers". These add-on dampers, utilize viscoelastic materials in exterior surface damping treatments for vibration and shock control. Two types of exterior surface damping treatments are commonly used: (a) free layer exterior damping treatment; and (b) constrained layer exterior damping treatment. Both of these exterior damping treatments can provide high levels of damping to a structure, i.e., dissipation of undesirable vibrations. Examples of such damping techniques are described, for example, in U.S. Pat. Nos. 2,819,032 (issued Jan. 7, 1953); 3,071,217 (issued Jan. 1, 1963); 3,078,969 (issued Feb. 26, 1963); 3,159,249 (issued Dec. 1, 1964); and 3,160,549 (issued Dec. 8, 1964).

Free layer damping treatment is also referred to as "unconstrained layer" or "extensional damping" treatment. In this technique, damping occurs by applying a layer of viscoelastic damping material to an external surface of a structure. The material can be applied to one or both sides of a structure. The mechanism by which this treatment dissipates undesirable energy (e.g., resonant vibrations), involves deformation. That is, when the structure is subjected to cyclic loading, for example, the damping material is subjected to tension-compression deformation and dissipates the energy through an extensional strain mechanism.

Another add-on damping treatment is constrained layer damping treatment. Constrained layer damping treatment is also referred to as "shear damping" treatment. For a given weight, this type of damping treatment is generally more efficient than the free layer damping treatment. In this technique, damping occurs by applying a damper of one or more layers of viscoelastic damping material and one or more flat layers of a higher tensile modulus material which is free of projections to the external surface of a structure. That is, this damping technique is similar to the free layer damping treatment wherein a viscoelastic material is applied to an exposed surface of a structure, the difference being that the viscoelastic material is additionally constrained by a flat projection-free layer having a higher modulus than the viscoelastic material, e.g., a metal layer, in the constrained layer treatment. Energy dissipates from the viscoelastic damping material via a shear mechanism that results from constraints by the higher modulus constraining layer and the base structure.

The problems associated with these dampers are numerous and have greatly limited the use of these dampers for PCB applications. These dampers typically cover a significant surface area of the PCBs (typically about 60–100% of the surface area on one side of the PCB to achieve significant damping benefits) and typically cover numerous short components or features [less than 0.04 inch (1.02 mm) in height], such as small integrated circuits, small resistors, circuit traces/lines, on the PCBs as a result. The coverage needed means that many PCBs cannot use dampers of this design as they do not have the needed "open" surface area for attachment of components or may require a costly damper design with cut-outs, holes, etc. These dampers may also require a thick damping polymer layer(s) to allow coverage of circuit components and to achieve good damping thus causing cost and application concerns. These damping treatments can be difficult to remove for rework, as removal can potentially cause damage to the PCB. As these dampers cover a large surface area, the ability to do failure analysis and rework in areas covered by the dampers is not directly possible.

In addition, these dampers can retain significant amounts of heat in the PCB, leading to premature component failures. The damping material could potentially be corrosive to components on the PCB and since such a large surface area is covered, it is difficult to isolate and leave uncovered components. These dampers tend to be large which can be costly in terms of raw materials and manufacturing, plus the dampers can add significant weight to the PCB. Non-metallic constraining layers are used since so many components come into contact or near contact with the damper and thus could short.

Although these exterior surface damping techniques are used, the degree of damping is oftentimes limited by maximum allowable thickness or other spacing requirements, obstructions on the circuit article surface which limits available damper coverage area, article accessibility, and/or environmental limitations. For example, if the circuit article is desired to be a component in a computer server design and thus has its surface nearly fully utilized by coverage of circuit components, the surface area needed to have an effective constrained layer damper is limited. In order for a known constrained layer damper to be effective, a large surface area of the article to be damped typically needs to be covered by the conventional constrained layer damper to be most effective. Typically 60–90% of the surface area of one side of the circuit board needs to be covered to most effectively damp the first 1–7 vibration mode shapes of the circuit board. The total circuit board surface area includes the upper surface, lower surface, and side(s). Some circuit boards have constrained layer dampers attached to both major sides of the circuit board to achieve acceptable damping.

For a circuit board in which one side has less components than the other, thus enabling the use of a constrained layer damper, the damper typically adds mass that is near the mass of the PCB base laminate itself, thus potentially doubling the weight of the PCB. The nearly full coverage constrained layer damper covers a large surface area and thus may significantly reduce the heat radiation, conduction or convection loss of the PCB leading to a hotter running PCB thus potentially reducing PCB component life or requiring added heat loss methods for the PCB or server design. The full coverage constrained layer damper also can be difficult to remove after application, rendering rework and/or inspection of the items covered by the by the damper impossible or impractical. As mentioned previously, the full size constrained layer damper may also need to cover some low profile components [<40 mils (1.02 mm)], such as a small resistors, small capacitors, etc. thus leading to a damper design requiring a very thick damping material to allow sufficient conformance to the PCB, increasing damping material cost.

A second known method of damping circuit articles includes isolation of the circuit article or the structure in which it is used. Vibration is controlled by isolating the circuit article from the vibration source. U.S. Pat. No. 4,053,943 (issued Oct. 11, 1977) describes a system for externally isolating a printed circuit board. Laminated damping elements are remotely positioned from and connected to the circuit board by post structural means fastened at each end to the circuit board and to the laminated damping element. Such an external isolation system adds to the overall size of the circuit board and may be impractical where close positioning of the circuit board to other structures is desired. Another isolation method is described in WO 92/21178. By increasing the natural frequency of the circuit board, isolation can be achieved, again requiring complex design.

Isolation of a circuit article within a structure may not always be possible due to overall thickness requirements, space requirements, and/or the number of components on the circuit article surface. In addition, some damping may be required in conjunction with isolation to obtain the desired damping results, particularly at low frequencies.

Another method to improve the vibration resistance of a circuit article is to attach an aluminum stiffener(s) as shown in FIG. 35. These stiffener(s) serve to stiffen the circuit article and make the circuit article more difficult to vibrate. The stiffener(s) also serve to change the natural frequencies of the circuit article. The stiffener in FIG. 35, which is discussed in more detail in Comparative Example 4, is a long thin rectangular piece of aluminum having two major opposed surfaces and having legs which extend from one side of the stiffener. The stiffener(s) is attached by soldering to the circuit article via the legs. Stiffeners are added to the circuit article until the desired results are achieved in terms of increased stiffness.

However, the stiffened design may also require attachment to an external structure to be most effective. The stiffened PCB can also be very difficult to rework due to the stiffeners being soldered to the PCB. The stiffeners can also make rework of the PCB time consuming and costly. The stiffening effect for a PCB also may have limited benefits for improved PCB reliability or vibration resistance, as the vibration energy is shifted around the PCB by stiffeners and is not significantly dissipated. Thus, other components may have increased vibration problems on the PCB (tall integrated circuits, tall capacitors, resistors or connectors, for example) as the stiffener has not reduced significantly the total vibrational energy reaching and effecting the PCB.

Circuit articles such as printed circuit boards may contain numerous components. Some of these components may be more massive than in the past. Examples include integrated circuit chips, heat sinks, etc. In addition, larger circuit boards are becoming more common increasing the likelihood of sagging or deflection of the PCB during dynamic or static inputs (i.e., during assembly or as an assembled part in a design) leading to a reliability problem with respect to the circuit boards' line traces, displacement of components and the likelihood of a more difficult installation of the PCB into a device, shelf, or rack due to sagging or vibrations. In addition, integrated circuit chips which are mounted via clips, pins, clamps, locks, pressure fits, channels, etc. are becoming increasingly popular. Compared to conventional integrated circuit chips which are mounted via adhesives, soldering etc., these removable chips are more susceptible to shock or vibration that can lead to small movements or micromotions that can create wear between components or surfaces, create heat, increase electrical resistance between components and can lead to poor electrical performance and/or chip connection failure and reliability problems.

Stiffening the PCB to make the PCB vibration resistant by increasing the natural frequencies of the PCB above the resonant frequencies that could be excited in the PCB by external forces such as by increasing the thickness of the PCB can be very expensive. Making the PCB thicker to increase stiffness adds material costs, can render the PCB non-standard for thickness, and can render processing longer and more complex. Furthermore, vibration energy may not be dissipated as desired.

The use of these vibration and shock control methods can add significant cost and/or complexity to the structure in which the circuit article is incorporated In addition their use is often limited by space considerations on and around the PCB surfaces, and also rework requirements. Moreover, failure analysis needs can be significantly reduced, the "package size" of the PCB can be significantly increased, costly manufacturing processes involving soldering on the PCB may be required, and a corrosion potential may need to be addressed for some designs. Other potential concerns include thermal conduction, thermal conductivity or thermal radiation changes caused by using the known dampers and stiffeners, in addition to the potential for electrical performance changes in the circuit article.

SUMMARY OF THE INVENTION

Thus, an alternative approach is needed to damp vibrational energy of a circuit article and improve the static and dynamic deflection i.e., sagging resistance and/or flexural stiffness of the circuit article without adversely affecting the dissipation of the circuit article (either by conduction, convection, and/or radiation). The approach preferably provides damping while having minimal surface area requirement on the circuit article (to allow maximum use of space for circuit components and/or traces) and minimal height requirement(s). Plus, the addition of damping to the circuit article should be convenient, cost effective and not significantly impact the reworking of the circuit article (i.e., easy to remove and replace) or inspection of the circuit article. In addition, the damping means should preferably be of a minimal mass. Preferably the means for damping should also be able to be applied as one of the last steps of the manufacturing process for the circuit article to allow greater circuit article manufacturing flexibility.

The present invention provides such a damped and stiffened circuit article. The present invention provides a novel damped and stiffened circuit article such as a damped and stiffened printed circuit board. The article of the present invention overcomes the limitations of the current damping techniques with respect to circuit articles.

The novel article of the invention comprises:

(a) a circuit article having at least one substantially flat surface;

(b) a vibration damping and stiffening member(s) attached to at least one substantially flat surface of the circuit article, wherein each vibration damping and stiffening member independently comprises:

(I) a constraining member, wherein the constraining member comprises:

(i) a base, wherein the base has an upper surface, a lower surface, and at least one side; and (ii) at least one projection attached to and extending away from the base in a manner such that at least one of the following is true: (A) at least one projection is attached to and extends away from an upper surface of the base, (B) at least one projection is attached to and extends away from a lower surface of the base, (C) at least one projection is attached to and extends away from an upper surface of the base and at least one projection is attached to and extends away from a lower surface of the base;

wherein the height of at least one projection is at least about 10% of the average thickness of the base;

(II) a vibration damping material layer(s) comprising a viscoelastic material(s) wherein the vibration damping material layer(s) have a loss factor of at least about 0.01 and a Young's modulus of at least about $3 \times 10^3$ Paccals at 25 degrees C., wherein the vibration damping material layer(s) is bonded to at least a portion of the lower surface of the base;

(III) optionally an intermediate connecting member attached to the vibration damping material layer(s) on a side opposite the constraining member, wherein the intermediate connecting member has a Young's modulus greater than the Young's modulus of the vibration damping material layer(s);

wherein the constraining member has a Young's modulus greater than the Young's modulus of the vibration damping material layer(s);

wherein the vibration damping and stiffening member(s) is attached to at least one substantially flat surface of the circuit article in a manner such that the circuit article is stiffened and vibrationally damped.

The vibration damped and stiffened circuit article of the invention is advantageous in that it can be designed such that it has minimal added weight, minimal heat retention (high thermal loss capabilities), a thermally stable design, and a minimal requirement of surface area on the circuit article for the vibration damping and stiffening members (VDSMs) to provide the desired properties. In addition, the novel article can be designed such that it is relatively low cost, easily reworkable and such the VDSM(s) are easily applied.

DETAILED DESCRIPTION OF THE INVENTION

Circuit Article

Figure 1:
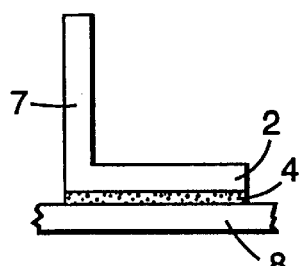
FIG. 1 is a schematic end view of an embodiment of the vibration damped and stiffened circuit article of the present invention wherein only a portion of the circuit article is shown.

The term "circuit article" as used herein includes circuit boards such as printed circuit boards (PCBs), flexible circuits, etc. Types of circuit boards include but are not limited to graphic circuit boards (multilayer boards, double sided boards, and single sided boards) and discrete wire boards. Circuit boards can be classified as rigid, flexible, or semi-flexible. The term "circuit boards" as used herein also includes circuit cards. The term "flexible circuits" as used herein includes flexible connectors, flexible circuits having components therein (such as resistors, capacitors, etc.), etc. Additional information regarding circuit articles can be found in the reference entitled *Printed Circuit Handbook*, Third Edition, Clyde F. Coombs, Jr. McGraw-Hill Book Co., New York, 1988, ISBN 0-07-012609-7.

The circuit article to which the VDSM(s) is attached is typically a laminate which can be prepared from any material suitable for circuit article designs. Useful materials from which the circuit article can be formed include, for example, resins such as epoxies, polyesters and phenolics, and resin reinforcement materials such as cotton paper, woven glass, mat glass, glass veil, metals (e.g., copper layers, etc.), and various flexible materials such as polyimides, polyesters, etc. depending on the circuit article design. Flexible circuit articles may also include, for example, polyimide, polyester, copper, etc. in their construction.

The manufacture of a circuit board typically starts with the formation of a laminate, i.e., layers of metal and resin coated fibers. For example, a laminate may be made when various layers of metal, e.g., copper, etc. and resin coated fibers, e.g., resin coated glass fibers, etc., are layered upon each other in various thicknesses and then heated under pressure to make the "laminate" structure that the final circuit board is built into and onto. Next, various processes can be employed, e.g., drilling, plating, etching, soldering, etc., to add features and electrical components to the laminate to create the final circuit board.

The novel damped and stiffened circuit article of the present invention has good damping and/or flexural stiffness properties thus solving vibration, shock and sagging or static or dynamic displacement problems in a variety of applications where circuit articles are exposed to vibration or shock or static or dynamic loads or forces.

Vibration Damping and Stiffening Members

Useful vibration damping and stiffening members (VDSMs) have at least one projection attached to and extending from a base upper and/or lower surface in a manner that adds rigidity to the VDSM. Typically the projection(s) extend from the base's upper surface. Projection(s) that extend from a base's lower surface typically extend from a portion of the base that extends out over an edge of the circuit article. Such a projection typically extends from a lower surface of the base such that it doesn't contact the circuit article itself. The vibration damping and stiffening member(s) is typically positioned in (either partially or completely) or near the areas of strain on the circuit article. The VDSM(s) when exposed to significant amounts of strain energy in various vibrational modes of interest, dissipate this vibrational energy as heat, thereby diminishing vibration and shock displacement oscillations and increasing the rigidity of the circuit article. The VDSM(s) can damp, i.e., reduce the vibrational or shock amplitude or duration of a wide variety of vibrational modes, e.g., bending, torsion, sway, and extensional/compression modes, etc., in a wide variety of circuit articles over a wide frequency and temperature range.

The vibration damping and stiffening member(s) can be attached to the surface(s) of the circuit article before, during or after the addition of various components to the circuit article. Preferably, the vibration damping and stiffening member(s) are attached to the circuit article surface by the vibration damping material layer(s) if it has adhesive properties or by some other attaching method (i.e., a separate adhesive such as an acrylate adhesive, an epoxy adhesive, etc.) or by an intermediate connecting member (discussed later herein) which is also attached to the circuit article (typically by an adhesive or mechanical fastener or welding). A VDSM may be attached to one or more of the following: an upper surface of the circuit article, a lower surface of the circuit article, and/or a side of the circuit article.

Preferably, a sufficient amount of surface area of the circuit article has vibration damping and stiffening member(s) attached such that the damping of the circuit article is improved by at least about 10% in at least one vibrational mode. High mechanical strains are introduced into the vibration damping material layer(s) when the article of the invention is excited at one or more of its natural frequencies. The resulting mechanical strain energy in the vibration damping material layer(s) is then dissipated in the form of heat. The higher the strain energy in the vibration damping material layer(s), the more vibration energy is dissipated from the circuit article.

A vibration damping and stiffening member, as previously mentioned, also adds stiffness to the circuit article, thus providing additional benefits. A circuit article, such as a PCB, may be of a dimension and/or weight such that the inherent flexural stiffness or rigidity of the circuit article is not sufficient to prevent sagging or deflection due to static or dynamic loading or occurrences. This can be problematic in a number of circumstances, such as when a circuit article such as a PCB is mounted into a chassis where it could sag or deflect and contact other circuit articles or structures and potentially cause damage. Also during shipment a similarly mounted non-stiffened circuit article such a PCB could sag with time and/or changes in temperature and potentially cause damage. Also, a non-stiffened similarly mounted circuit article such as a PCB may experience vibrations and shocks that could allow the circuit article to be deflected causing damage to the circuit article or structures around it.

The attachment of at least one vibration damping and stiffening member as described herein can increase the rigidity of the circuit article. Due to the increased rigidity provided by the VDSM(s) the circuit article could potentially be made thinner and lower in weight thus providing a cost savings in raw materials used in preparing the circuit article, as well as lower processing costs (such as less drilling time for through holes, less tool wear, less difficulty in plating through holes, etc.) and provide a lower weight overall design.

The location of the vibration damping and stiffening member(s) on the surface of the circuit article is determined based upon the specific degree of damping and/or flexural rigidity or stiffness needed. The identification of these locations can be determined by one skilled in the art of modal analysis or finite element analysis.

As mentioned previously, vibration damping and stiffening member(s) can be effectively used to add significant damping to the circuit article and also add significant rigidity or stiffness. In many cases only a minimal surface area of the article is covered to achieve some desired level of these benefits. Typically the surface area coverage of the vibration damping and stiffening member(s) on the circuit article is about 0.005% to about 20% of the total surface area of the circuit article [wherein the total surface area includes the upper surface, the lower surface, and the side(s) of the circuit article], preferably about 0.005% to about 15%, more preferably about 0.05% to 10%, and most preferably about 0.05% to about 5%.

The vibration damping and stiffening member(s) may be attached, for example, such that they span various "lengths" and/or "widths" and/or "diagonals" of the circuit articles, on one or more surfaces of the circuit article. Once a determination has been made of the desired flexural rigidity/stiffness and damping needed for a circuit article, location of the components such as key chips, integrated circuits, etc. can be arranged to allow an optimum span design of the vibration damping and stiffening member(s) to achieve the desired performance. Typically one to six VDSMs are attached to a side of a circuit article, more typically one to three VDSMs per side.

Useful spans for the vibration damping and stiffening member(s) on the circuit article for lengths, widths, and diagonals, for example, are typically between about 0.05% and 120% of the maximum span of the circuit article in each direction, with preferred spans of about 10% to about 120%, more preferred spans of about 35% to about 100%, and most preferred spans of about 50% to about 100%. For example, if a circuit article (such as a circuit board) has a length of x cm, a VDSM which is attached such that it extends along a length may be, for example, 50 percent of x (one half the length), 100 percent of x (equal to the length), or 120 percent of x (greater than the length) in which case if it is straight it would extend over the edge of the circuit article. If an entire circumference is to be spanned it would typically span only 100 percent of the circumference to avoid overlap of the VDSM onto itself. Frequently at least a portion of a width and a portion of a length are covered by VDSMs.

The vibration damping and stiffening member(s) can be designed and positioned to span at least a portion of the wavelength of the lowest mode of vibration that is desired to be damped for either the major mode(s) of vibration that can extend from an end to end of a circuit article, and/or local modes associated in area's within the circuit article. Typically, a VDSM(s) will span a distance at least about 0.1 times the full wavelength of the lowest mode desired to be damped, preferably at least about 0.3 times the full wavelength of the lowest mode desired to be damped, more preferably at least about 1 times the full wavelength of the lowest mode desired to be damped, even more preferably at least about 2 times the full wavelength of the lowest mode desired to be damped, and most preferably at least about 5 times the full wavelength of the lowest mode desired to be damped (for example, the first mode, second mode, third mode, fourth mode, fifth mode, etc.). A single VDSM may be used to span a certain distance or alternatively multiple VDSMs can be used to span the same distance.

The VDSM increases the amount of compression and tension strain energy entering the vibration damping material layer(s) as compared to a similar flat constrained layer that has a constraining layer with the same design as the base of the VDSM. Shear strain energy directed into the vibration damping material layer(s) can also be increased with the VDSM used according to the invention. The strain energy increases are related to the improved flexural rigidity, stiffness and bending moment change of the VDSM design as compared to a flat constrained layer damper. The neutral axis of a VDSM attached to the circuit article can also be shifted to a location to improve shear and/or compression tension strain entering the vibration damping material as compared to a flat constrained layer damper.

The vibration damping and stiffening member(s) may optionally have one or more of the following: cut-outs, notches, slits, bends, embossing, coining, folds, flaps, curves, steps, variable heights, various angles, etc. as needed to avoid components or features of the circuit article or structures near the circuit article that could interfere with the vibration damping and stiffening member(s) and to also improve damping or stiffening of the VDSM.

Typically, a vibration damping and stiffening member(s) is attached to the exterior surface(s) of a circuit article in a manner such that the added damping increases the vibrational damping, as measured by the system loss factor, i.e., the loss factor of the circuit article to which the VDSM(s) are attached, by at least about 10% in at least one vibrational mode, preferably at least about 50%, more preferably at least about 100%, and most preferably at least about 200% at a temperature of 25 degrees C., for example, as compared to the reference circuit article. The reference circuit article is the same circuit article but without any VDSM(s) attached.

Typically, a VDSM is attached to the exterior surface of the surface article such that the flexural stiffness and/or flexural rigidity and/or a bending moment of the circuit article is at least about 1.05 times that of the reference circuit article, more typically at least about 1.5 times that of the reference circuit article, preferably at least about 5 times that of the reference circuit article, more preferably at least about 25 times that of the reference circuit article, and most preferably at least about 100 times that of the reference circuit article. These measurements for both the article of the invention and the reference circuit article are made over the same length and width of span measured.

The flexural stiffness and/or rigidity and/or bending moment of the damped and stiffened circuit article can also be evaluated using the deflection of the damped and stiffened circuit article as compared to its respective reference design. The "reference circuit article" has been defined above. The deflection for a circuit article of the invention is typically reduced by at least about 2%, more typically at least about 5%, preferably at least about 10%, more preferably at least about 25%, and most preferably at least about 50%, compared to its respective reference circuit article. The measurement for each circuit article of the invention and its respective reference circuit article are calculated at the same specific length and width of span and at the same input excitation level which may be either a static or dynamic input.

The vibration damping material layer(s) and/or stand-off member and/or any optional adhesive layers which may be used to attach a VDSM to a circuit article are preferably of a sufficient thickness to allow coverage, if desired, of small surface features of less than 0.4 inch (10.16 mm) in height (such as electrical line traces, defects in the circuit article, bumps, voids, protrusions, intrusions, high spots, non-flat conditions, etc.) in order that the VDSM be adequately bonded to the circuit article, such that when the circuit article is excited by a vibration or shock, the VDSM is not displaced (i.e., it does not fall off, delaminate totally or partially, shift or move and potentially contact a sensitive component or connection).

A VDSM can optionally totally or partially cover such small components or features [less than 0.4 inch (10.16 mm) in height]. It is desirable to limit the number of items covered to minimize the change in heat flow characteristics of the circuit article. As mentioned above, the height of the items or features optionally covered by the VDSM (totally or partially) should be less than 0.4 inch (10.16 mm). Preferably their height would be less than 0.3 inch (7.62 mm), more preferably less than 0.1 inch (2.54 mm), and most preferably less than 0.050 inch (1.27 mm). Surfaces that have features and/or components less than 0.4 inch in height (10.16 mm) are considered to be "substantially flat".

As an item to be covered by the vibration damping material layer(s) becomes taller, the ability to maintain a reasonably thin vibration damping material layer(s) for optimum damping and stiffness of the circuit article becomes more difficult. As the vibration damping material thickness increases beyond a design optimum the damping improvement to the circuit article begins to drop. The damping performance will become more similar to a "free layer" damper as the damping material becomes quite thick. The amount of stiffness added to the circuit article by the VDSM(s) will decrease as the vibration damping material layer(s) becomes thicker past an optimum thickness. It is important to note, however that the optimum vibration damping material layer(s) thickness for damping does not necessarily correlate with the optimum thickness for stiffness. In applications of quite thick vibration damping material layer(s), the added stiffness to the circuit article by the vibration damping and stiffening member will be dependent on the Young's modulus of the vibration damping material layer(s), and less on the constraining member. Thus it is preferable to have the vibration damping material layer thickness less than 0.5 inch (12.7 mm), more preferably less than 0.4 inch (10.2 mm), even more preferably less than 0.2 inch (5.1 mm), and most preferably less than 0.1 inch (2.54 mm). If a vibration damping material also contains a high modulus component(s) such as fibers, fillers, particulate, wires, etc. then the negative effect of increased damping material layer thickness on damping performance and/or stiffness can be significantly reduced. Typically the thickness of the vibration damping material layer(s) ranges from about 0.002 to about 0.15 inch (about 0.05 to about 3.81 mm), more typically about 0.005 to about 0.07 inch (about 0.127 mm to about 1.78 mm) thick.

The vibration damping material layer(s) which are attached to the bottom surface of the base of the constraining member, have an upper surface by which they are attached to the base, at least one side, and a lower surface through which they are typically bonded to the circuit article or optionally to an intermediate connecting member which is then attached to the circuit article. It is preferred that the vibration damping material layer(s) have their entire lower surface in contact with the circuit article or their entire lower surface in contact with an intermediate connecting member which then has its entire lower surface bonded to the circuit article.

As way of illustration, it would be disadvantageous if the vibration damping material layer(s) were positioned over a large depression in the circuit article such that very little of the lower surface of the vibration damping material layer(s) was actually in contact with the circuit article. A greater contact percentage facilitates passing of shear and/or compression and tension strain energy from the circuit article into the vibration damping material. A VDSM typically has at least about 50% of the lower surface of its vibration damping material layer(s) in contact with the circuit article or an intermediate connecting member, preferably at least about 70%, more preferably at least about 90%, even more preferably 95 to 100%, and most preferably 100%. That is, it is preferred that the vibration damping material layer(s) substantially conform to the circuit article surface to which the VDSM is attached or to the intermediate connecting member to which it is attached. Likewise it is preferred that any intermediate connecting member have a lower surface that substantially conforms to the circuit article to which it is attached at the same aforementioned percentages referred to when discussing the attachment of the vibration damping material layer(s) to the circuit article.

The damped and stiffened circuit article of the present invention is advantageous in that the vibration damping and stiffening member(s) may be designed to take up the minimum surface area needed to provide good attachment to the circuit article and also provide the needed damping and improved stiffness.

Typically a VDSM has a volume that is about 2–85% of the volume of the smallest rectangular box in which it will fit, more typically about 2–70%, even more typically about 2–50%, even more typically about 2–45% and most typically about 2–40%.

The VDSM can also be designed to increase heat loss of the circuit article by having the VDSM absorb heat from the circuit article and then dissipate the heat to the environment by convection, conduction, and /or radiation. The VDSM can act as a heat sink and still perform the damping and stiffening function. The VDSM could also be attached to the circuit article over small heat producing components [less than 0.4 inch (10.2 mm)in height] to increase their heat loss rate. The VDSM is optimized for heat flow and heat loss by having projection(s) with a large surface area to allow greater heat loss by convection, conduction and/or radiation and also having the vibration damping material layer(s) comprise one or more of the following: filler(s), fiber(s), particulate, which improve the vibration damping material layer(s)' thermal conductivity.

The total surface area of all the projection(s) on a VDSM is typically at least about one time the base exposed surface area, more typically at least about 3 times the base exposed surface area, preferably at least about 7 times the base exposed surface area, more preferably at least about 25 times the base exposed surface area, and most preferably at least about 100 times the base exposed surface area. The "base exposed surface area" is defined as the surface area of the base of the VDSM, and includes any exposed top, bottom and side(s) surfaces that are not covered by vibration damping material or projection(s).

As circuit boards generate more heat, the need to dissipate heat to the surrounding environment will be critical for high reliability products. As integrated circuit chips, capacitors, resistors, etc. become more numerous on a circuit board, operating speeds become faster, the circuit board temperature will rise. The VDSM can be designed to allow improved heat loss in addition to the added stiffness and vibration damping provided. The VDSM can also be made to direct air flow (such as to or from fans) across the circuit article so air is directed to the hottest or most critical components to improve their heat loss. The useful VDSMs that also improve heat flow, can reduce a specific component and/or a specific circuit board area and/or total circuit board area temperature by at least about 2 percent, preferably at least about 5 percent, more preferably at least about 10 percent, and most preferably by at least about 25 percent by means of one or more of the following: 1) convection, 2) conduction 3) radiation and/or 4) redirected air flow to increase air mass flow across desired components.

Constraining Member

A vibration damping and stiffening member has a constraining member comprising a base and at least one projection extending therefrom that serves to stiffen the member and ultimately the circuit article to which is attached.

The constraining member may comprise, for example, a metal such as stainless steel, brass, copper, titanium, aluminum, etc.; glass; a polymeric material such as polyester, polyimide, polystyrene, polycarbonate, polysulfone, etc.; an epoxy laminate; a carbon reinforced epoxy laminate; and combinations thereof. The constraining member as well as the various features of the constraining member may be formed from the same or different material. For example, the base may comprise a polysulfone and a projection may comprise stainless steel. The constraining member of the VDSM may optionally be of a multilayer design. That is the constraining member may comprise a laminate of two or more layers, the laminate having been molded into the desired shape such that both the projection(s) and base are formed from the same laminate.

An alternative construction is wherein the projection is formed of one material such as aluminum and the base is a laminate such as a copper or fiber re-enforced epoxy laminate. Thus the base and/or projection(s) each could be a monolithic material and/or each could be a laminate material (such as aluminum/vibration damping material/aluminum) with two, three, four or more layers. As mentioned previously, the constraining member comprises a base and at least one projection extending therefrom. The upper and lower surfaces of the base, not including the projections, are preferably substantially parallel in at least one location, more preferably parallel in at least one location, even more preferably substantially parallel throughout, most preferably parallel throughout (in all locations).

The base is generally flat and will allow conformance of the vibration damping material layer(s) to the circuit article surface or intermediate connecting member. The length, width and thickness of the base can vary. However, as mentioned above, preferably the upper and lower surface of the base are parallel or essentially parallel. Frequently the base is rectangular in cross-section and when viewed from above. The base can also be non-flat in areas to allow conformance to the circuit article. The lower surface of the base in some circumstances may comprise two perpendicular intersecting flat surfaces in order that the VDSM fit well along a top surface and edge of a circuit article. Preferably, the upper surface of the base would be parallel to the lower surface of the base. Both the upper and lower surfaces of the base may optionally comprise two or more intersecting flat surfaces (typically perpendicularly intersecting).

The projection(s) and/or base of the constraining member can be made at the same time as a one piece construction or separately and subsequently attached to each other. With respect to the first method, the entire constraining member (comprising the base and projection(s)) may be made, for example, by bending, folding or otherwise manipulating flat stock material. A one piece constraining member may also be made by casting, molding (injection, blow, etc.), continuous casting, extruding, forming, etc.

With respect to the second method, a separate projection (s) could be attached to a separate base to form a constraining member in numerous ways, such as by bonding with an adhesive such as an epoxy, an acrylate etc.; injection molding together as an assembly; heat or sonic welding; etc.

The constraining member (comprising the base and the projection(s)) can have a wide variety of cross-sectional configurations, such as, for example, shapes associated with English alphabetic shapes such as "L", "V", "I", "W", "Z", "K", "E", "F", "H", "J", "M", "N", "P", angled "U", angled "C", angled "D", angled "O" (hollow rectangular), and "T". Depending on the shape and desired effect, these members may be used right side up, sideways, upside down, reversed, etc. The vibration damping material layer(s) is attached to the lower surface of the base of the constraining member (preferably the entire lower surface of the base). The lower surface of the base is the portion of the base in closest proximity to the circuit article, upon attachment of the VDSM to the circuit article.

The VDSM(s) allow for unique damping of circuit articles. They can provide optimum damping in many modes of vibration in two or three dimensions. They can also bypass features or components on the circuit article. A vibration damping and stiffening member which is attached to the circuit article may have a variety of shapes as viewed from directly above. Examples of such top view shapes include, but are not limited to polyhedrons, such as rectangles, trapezoids, triangles, pentagons, etc.; circles; ovals; English alphabetic shapes such as "A", "C", "P", "L", "V", "I", "J", "S", "E", "K", "X", "M", "H", "Y", etc.; numerical shapes such as "4", "1", etc., plus signs (+), minus signs (−), modifications thereof, etc.; and partial, incomplete, or interrupted configurations of the aforementioned.

Assuming a flat base, for example, with the vibration damping material layer(s) on the lower surface of the base, various projection(s) from the base can significantly improve the flexural rigidity and/or bending moment and/or stiffness of the base and ultimately the circuit article to which the VDSM is attached. These projection(s) attached to and extending from the base may have a variety of shapes including but not limited to geometric shapes such as rectangular shapes, triangular shapes, etc.; English alphabetic shapes such as "A", "K", "N", "X", "W", "R", "Y", "P", "F", "H", "E", "J", "V", "M", angular "C"; numerical shapes such as 1, 7, etc.; plus sign shapes (+); minus sign shapes (−); modifications thereof; and combinations thereof. Examples of such modifications include increased or decreased angles, extended lengths, collapsed shapes, compressed shapes, magnified features, points, cut-outs, bends, curves, various folds (in, out, up, down), etc. For example, a projection which is folded may have "loose" folds or a tightly folded "accordion" design. Each projection is attached by at least one end, sometimes two or more ends to the base. For example, a "T" shaped projection may be attached by one end in some situations, an angular "C" shaped projection may be attached by both ends in some situations, and an "E" shaped projection may be attached by three ends in some situations. Each projection should be attached to and extend away from the base, although it is possible that some projections may be curved or bent, for example, such that section(s) of the projection such as their ends, for example, may be close to the base. The projection is considered to extend away from the base even if only the initial portion of the projection follows in a direction away from the base.

For a typical application, such as a circuit board application, the vibration damping and stiffening member's constraining member has a Young's modulus greater than about $0.0002 \times 10^6$ psi ($1.37 \times 10^6$ Pascals), preferably greater than about $0.2 \times 10^6$ psi ($1.38 \times 10^9$ Pascals), more preferably greater than about $2 \times 10^6$ psi ($1.38 \times 10^{10}$ Pascals), and most preferably greater than about $8 \times 10^6$ psi ($5.52 \times 10^{10}$ Pascals). Typically, the base and projection(s) will have the same aforementioned modulus values. However, in some situations the base and/or projection(s) may have an inner layer(s) of a lower modulus material, which may even be a vibration damping material. However, the constraining member still would have to have a high enough content of higher Young's modulus material such that the constraining member has a higher Young's modulus than the vibration damping material layer(s) of the VDSM attached to the lower surface of the constraining member. The projection(s) are not considered when calculating the thickness of the base as the projection(s) are not considered to be part of the base.

The thickness of the base will typically, on average, fall within the range of about 0.001 to about 0.3 inch (about 0.0254 to about 7.62 mm), preferably about 0.005 to about 0.15 inch (about 0.127 to about 3.81 mm), more preferably about 0.005 to about 0.08 inch (about 0.127 to about 2.03 mm), and most preferably about 0.005 to about 0.05 inch (about 0.127 to about 1.27 mm). The width of the base typically ranges from about 0.05 to about 3 inches (about 1.27 to about 76.2 mm), more typically about 0.100 to about 2 inches (about 2.54 to about 50.8 mm), most typically about 0.1 to about 0.5 inches (about 2.54 to about 12.7 mm).

The maximum height of a projection will typically be a multiple of the base's average thickness and is typically about 0.1–1000 times the base's average thickness, preferably about 0.5–100 times the base's average thickness, more preferably about 5–50 times the base's average thickness, and most preferably about 10–25 times the base's average thickness. Typically, the base's thickness will be constant rather than vary.

Typically, the height of the projection ranges from about 0.001 to about 3 inches (about 0.0254 to about 76.2 mm), more typically about 0.05 to about 1 inch (about 1.27 to about 25.4 mm), and most typically about 0.05 to about 0.5 inches (about 1.27 to about 122.7 mm). The average thickness of the projection is typically about 10 percent to 400 percent of the average base thickness, more typically about 75 to about 250 percent. One skilled in the art should be able to measure the height of a particular projection. The height of a projection is typically measured as follows.

When a projection extends from an upper surface of a base and has a configuration which does not extend at all below the upper surface of the base, the height of the projection is the greatest distance from a point on the projection to a point on the upper surface of the base directly below it. This would be along a line perpendicular to the upper surface of the base, where a parallel line from the base may need to be extended to intercept the perpendicular line from the projection.

When a projection extends from a lower surface of a base and has a configuration which does not extend at all above the lower surface of the base, the height of the projection is measured as the greatest distance from a point on the projection along a perpendicular line to a point on the lower surface of the base directly above it. This would be along a line perpendicular to the lower surface of the base where a parallel line from the base may need to be extended to intercept the perpendicular line from the projection.

When a projection extends from an upper surface of a base and extends both above and below the upper surface of the base and the lower surface of the base, the height of the projection is measured as the maximum distance between the uppermost and lowermost portion of the projection as measured by a line which would be perpendicular to the base where a parallel line from the base may need to be extended to intercept the perpendicular line from the maximum projection.

When a projection extends from a lower surface of a base and extends both above and below the upper surface of the base and the lower surface of the base, the height of the projection is measured as the maximum distance between the uppermost and lowermost portion of the projection as measured by a line which would be perpendicular to the base where a parallel line from the base may need to be extended to intercept the perpendicular line from the projection.

Vibration Damping Material

A VDSM may comprise one or more layers of vibration damping material. These layers may be the same or different. For example, they may have different densities, different performance ranges for damping, different environmental resistance properties, different glass transition temperatures (Tgs), different loss factors, and/or different chemical makeup (different cross-linkers, different additives, different thickeners, different monomer types, different monomer ratios, different particulate and/or fiber loading, etc.), different component amounts, etc.

A vibration damping material layer(s) of a VDSM may be continuous or discontinuous. A continuous vibration damping layer may comprise one type of damping material or may comprise adjacent sections of different vibration damping materials, for example. A discontinuous layer may comprise sections of vibration damping material separated by non-damping material(s) or space(s), for example. The vibration damping material(s) may optionally be separated by spaces, non-damping material layer(s) or segment(s) (such as aluminum, stainless steel, polyester, polyimide, polyethylene, paper, fiber and/or particulate reinforced epoxy type materials, etc.).

These variations in materials can potentially be used to improve vibration damping and/or thermal conductivity performance of the VDSM. The vibration damping material (s) used with the vibration damping and stiffening member can comprise any material that is viscoelastic or a blend of different viscoelastic materials. A viscoelastic material is one that is viscous, and therefore capable of dissipating energy, yet exhibits certain elastic properties, and therefore capable of storing energy at the desired temperature and frequency range. That is, a viscoelastic material is an elastomeric material typically containing long-chain molecules that can convert mechanical energy into heat when they are deformed. Such a material typically can be deformed, e.g., stretched, by an applied load and gradually regain its original shape, e.g., contract, sometime after the load has been removed.

Preferred viscoelastic materials are those having a Young's modulus of at least about 1 psi ($6.9 \times 10^3$ Pascals) and a loss factor of at least about 0.01 at the operating temperature and frequency of the article (which is typically about −40 to 200 degrees C., more typically about −40 to about 125 degrees C., most typically about −25 to about 100 degrees C. and 0 to 20,000 Hz). An example of a specific temperature and frequency at which these can be tested is 25 degrees C. and 50–5000 Hz.

The Young's modulus of useful viscoelastic materials can be as high as 500,000 psi ($3.45 \times 10^9$ Pascals), for example; however, typically it is about 10–2000 psi ($6.9 \times 10^4$–$1.4 \times 10^7$ Pascals). Preferred viscoelastic materials provide the structure, i.e., the damped and stiffened circuit article, with a strain energy ratio, i.e., fraction of strain energy stored in the damping material relative to the total strain energy stored in the structure, of at least about 0.1%, preferably at least about 1%, more preferably at least about 3%, and most preferably at least about 7%.

Suitable viscoelastic materials, at the operating temperature and frequency, for use in the vibration damping materials of the present invention have a loss factor, i.e., the ratio of energy loss to energy stored, of at least about 0.01. Preferably the loss factor of the viscoelastic material and the vibration damping material is at least about 0.1, more preferably about 0.5–10, and most preferably about 1–10, at the operating frequency and temperature experienced by the material. This loss factor represents a measure of the energy dissipation of the material and depends on the frequency and temperature experienced by the material. (This can be measured, for example, at 20 degrees C. and 100 Hz.) For example, for a particular crosslinked acrylic polymer (3M Brand ISD-112 vibration damping polymer), at a frequency of 100 Hz, the loss factor at 68° F. (20° C.) is about 1.0, while at 158° F. (70° C.) the loss factor is about 0.7.

Preferred viscoelastic materials are those that remain functional over a wide range of temperatures, e.g., −40° C. to 350° C. Most preferred viscoelastic materials are those that cover the broadest temperature and frequency range at the desired minimum loss factor and Young's modulus to achieve acceptable damping of the circuit article and which do not experience a significant degradation in properties due to long exposures at high temperatures or short exposures beyond these high temperature levels.

Useful viscoelastic damping materials can be isotropic as well as anisotropic materials, particularly with respect to its elastic properties. As used herein, an "anisotropic material" or "nonisotropic material" is one in which the properties are dependent upon the direction of measurement. Suitable viscoelastic materials include urethane rubbers, silicone rubbers, nitrile rubbers, butyl rubbers, acrylic rubbers, natural rubbers, styrene-butadiene rubbers, and the like. Other useful damping viscoelastic materials include polyesters, polyurethanes, polyamides, ethylene-vinyl acetate copolymers, polyvinyl butyral, polyvinyl butyral-polyvinyl acetate copolymers, epoxy-acrylate interpenetrating networks, and the like. Specific examples of useful materials are disclosed or referenced in U.S. Pat. No. 5,183,863 (issued Feb. 2, 1993), U.S. Pat. No. 5,262,232 (issued Nov. 16, 1993), and U.S. Pat. No. 5,308,887 (issued May 3, 1994), all of which are incorporated herein by reference.

U.S. Pat. No. 5,262,232 discloses a method for using acrylate-containing thermoset resins as vibration damping materials. The method for damping the vibration of a vibrating solid article at 1 Hz comprises providing a viscoelastic layer construction with at least one layer of an epoxy-acrylate thermoset resin.

U.S. Pat. No. 5,308,887 discloses a silicone/acrylic based composition which, it is believed, would be useful as a vibration damping material according to the present invention.

The viscoelastic damping material useful in the invention can be a thermoplastic polymer or a thermoset polymer. Preferably, the viscoelastic damping material is a thermoset type polymer, such as an acrylate.

Examples of thermoplastic materials suitable for use as the vibration damping material in vibration damping and stiffening members according to the present invention include, but are not limited to, those selected from the group consisting of polyacrylates, polycarbonates, polyetherimides, polyesters, polysulfones, polystyrenes, acrylonitrile-butadiene-styrene block copolymers, polypropylenes, acetyl polymers, polyamides, polyvinyl chlorides, polyethylenes, polyurethanes, and combinations thereof Useful viscoelastic materials can also be crosslinkable to enhance their strength and processability. Such viscoelastics are classified as thermosetting resins. When the viscoelastic material is a thermosetting resin, then prior to the manufacture of the VDSM, the thermosetting resin is in a thermoplastic state. During the manufacturing process, the thermosetting resin can be further cured and/or crosslinked typically to a solid state, although it could be a gel upon curing as long as the cured material possesses the viscoelastic properties described above. Depending upon the particular thermosetting resin employed, the thermosetting resin can include a curing agent, e.g., catalyst, which when exposed to an appropriate energy source (such as thermal energy) the curing agent initiates the polymerization of the thermosetting resin. Particularly preferred viscoelastic damping materials are those based on acrylates.

In general, any suitable viscoelastic material can be used. The choice of viscoelastic material for a particular set of conditions, e.g., temperature and frequency of vibration, etc., is within the knowledge of one of skill in the art of viscoelastic damping. It is to be understood that blends of any of the foregoing materials can also be used.

In addition to the viscoelastic material, the vibration damping material of certain preferred embodiments of the present invention includes an effective amount of a fibrous and/or particulate material. Herein, an "effective amount" of a fibrous material and/or particulate is an amount sufficient to impart at least improvement in desirable characteristics to the viscoelastic material. Generally, the fibrous and/or particulate material is used in an amount effective to increase the strain energy ratio of a VDSM containing the same amount and type of viscoelastic material without the fibrous or particulate material. Generally, an increase in the strain energy ratio of a factor of at least about two in at least one vibrational mode is desired.

Typically, this requires incorporating about 3–60 wt. % of the fibrous material into the vibration damping material, based on the total weight of the vibration damping material. Preferably, the fibrous material is a nonmetallic fibrous material, such as glass.

Typically, this requires incorporating about 0.5–70 wt. % of the particulate material into the vibration damping material, based on the total weight of the vibration damping material.

Typically, the amount of the fibrous material in the viscoelastic material is within a range of about 3–60 wt. %, preferably about 10–50 wt. %, more preferably about 15–45 wt. %, and most preferably about 20–40 wt. %, based on the total weight of the vibration damping material.

Typically, the amount of the particulate material in the viscoelastic material is within a range of about 0.5–70 wt. %, preferably about 1–45 wt. %, more preferably about 5–40 wt. %, and most preferably about 5–30 wt. %, based on the total weight of the vibration damping material.

The fibrous material can be in the form of fibrous strands or in the form of a fiber mat or web, although fibrous strands are preferred. The fibrous strands can be in the form of threads, cords, yarns, rovings, filaments, etc., as long as the viscoelastic can wet the surface of the material. They can be dispersed randomly or uniformly in a specified order. Preferably, the fibrous strands, i.e., fibers or fine threadlike pieces, have an aspect ratio of at least about 2:1, and more preferably an aspect ratio within a range of about 2:1 to about 10:1. The aspect ratio of a fiber is the ratio of the longer dimension of the fiber to the shorter dimension.

The fibrous material can be composed of any material that increases the damping capability of the viscoelastic material. Examples of useful fibrous materials in applications of the present invention include metallic fibrous materials, such as aluminum oxide, magnesium, or steel fibers, as well as nonmetallic fibrous materials, such as fiberglass. Generally, high Young's modulus fibrous materials, i.e., those having a modulus of at least about 1,000,000 psi ($6.9 \times 10^9$ Pascals), are preferred. Most preferably, the fibrous material is nonmetallic. The nonmetallic fibrous materials can be a variety of materials, including, but not limited to, those selected from the group consisting of glass, carbon, minerals, synthetic or natural heat resistant organic materials, and ceramic materials. Preferred fibrous materials for the VDSMs used according to the present invention are organic materials, glass, and ceramic fibrous material.

By "heat resistant" organic fibrous material, it is meant that useable organic materials should be sufficiently resistant to melting, or otherwise softening or breaking down, under the conditions of manufacture and use of the circuit article of the present invention. Useful natural organic fibrous materials include, but are not limited to, those selected from the group consisting of wool, silk, cotton, and cellulose. Examples of useful synthetic organic fibrous materials include, but are not limited to, those selected from the group consisting of polyvinyl alcohol, nylon, polyester, rayon, polyamide, acrylic, polyolefin, aramid, and phenol. The preferred organic fibrous material for applications of the present invention is aramid fibrous material. Such a material is commercially available from Dupont Co., Wilmington, Del. under the trade names of "Kevlar" and "Nomex."

Generally, any ceramic fibrous material is useful according to the present invention. An example of a ceramic fibrous material suitable for the present invention is NEXTEL™ which is commercially available from Minnesota Mining and Manufacturing Co., St. Paul, Minn. Examples of useful, commercially available, glass fibrous material are those available from PPG Industries, Inc. Pittsburgh, Pa., under the product name E-glass bobbin yarn; Owens Corning, Toledo, Ohio, under the product name "Fiberglass" continuous filament yarn; and Manville Corporation, Toledo, Ohio, under the product name "Star Rov 502" fiberglass roving.

Advantages can be obtained through use of fibrous materials of a length as short as about 100 micrometers. The fibers are not limited in length but much longer fibers may provide insufficient fiber interface and therefore decreased shearing surfaces between fibers. The fiber thickness or diameter for typical fibrous material is typically at least about 5 micrometers. The thinner the fiber, the higher the surface area of the fibrous material. Thus, preferred fibrous materials are very thin. The thickness of the fiber is also dependent upon the desired thickness of the overall damping material layer(s) that will be used in the VDSM. Thus, many common fibers may not be suitable if the overall damping material thickness is relatively thin (e.g., 0.005 mm to 0.010 mm).

The particulate material useful in the invention can be in the form of nodules, bubbles, beads, flakes, or powder, as long as the viscoelastic can wet the surface of the material. The particulate material can vary in size, but should not typically be greater than the thickness of the damping material layer. Preferably, the particulate material is on the size order of about 0.1 to about 5 micrometers and more preferably about 0.1 to about 2 micrometers.

The addition of fiber or particulate to the damping material may also have the potential effect of increasing the interlaminar strength or adhesion or peel strength between the vibration damping and stiffening member(s) and the circuit article. The fibers and/or particles can also increase the bulk modulus of the damping material thus improving the transmission of mechanical forces through the damping material layer. The fibers and/or particulates depending on their thermal conductivity properties may provide the vibration damping material with improved thermal conductivity and/or other damping benefits. Higher thermal conductivity fiber/particulate materials are preferred for improved thermal conductivity of the vibration damping material. Examples of such materials include but are not limited to those selected from the group consisting of aluminum oxide, boron nitride, copper aluminum, stainless steel, etc.

Examples of generally useful particulate materials in applications of the present invention include but are not limited to coated or uncoated glass and ceramic bubbles or beads such as thermally conductive bubbles, powders such as aluminum oxide powder and aluminum nitride powder, silica, metal flakes such as copper flakes, cured epoxy nodules, and the like.

In some cases it may be preferable for the particulate material to be a non-electrically conducting material, such as glass or aluminum oxide. Alternatively the particulate material may be an or an electrically conducting material that conducts only in a single direction such that electrical connection can be achieved between the circuit article surface and vibration damping and stiffening member (for example, to provide a grounding path for static charge dissipation and/or protection.)

Particulate materials having a Young's modulus of at least about 10,000 psi ($6.9 \times 10^7$ Pascal's), are preferred. More preferably, useful particulate materials have a Youngs modulus of about 100,000 psi ($6.9 \times 10^8$ Pascals). Most preferable are those with a Young's modulus of at least 1,000,000 psi ($6.9 \times 10^9$ Pascals).

In addition to fibers and particulate material, the vibration damping material can include additives such as fillers (e.g., talc, etc.), colorants, toughening agents, fire retardants, antioxidants, antistatic agents, and the like. Sufficient amounts of each of these materials can be used to effect the desired result.

Combinations of fibrous material and particulate material would also be useful and would be used in the range of about 0.5 to about 70 weight percent based on the total weight of the vibration damping material.

Some circuit articles can have exposed electrical traces and/or components or can be located near other structures that are sensitive to corrosion due to harsh environments or materials that can leach or outgass from the vibration damping material of a VDSM or from a bonding material such as an adhesive that may serve to attach the VDSM to the circuit article or may serve to attach components of the VDSM together. Examples of sensitive traces and components include, for example, exposed copper traces, electrical components, solder, connection legs, integrated circuits etc. These circuit article may require that the vibration damping material or bonding material be low outgassing and/or have a low corrosive material content [as low as 1–100 parts per billion (ppb) for some corrosive materials, others in the 100–3000 parts per million (ppm) range], or that components that could cause corrosion problems, manufacturing problems, reliability problems, undesirable odors, and/or leave undesirable residues upon removal, etc. (such as chlorides, silicones, acids, bases, alcohols, solvents, ions, anions, esters, amides, amines, extractable hydrocarbons, organotin compounds, tin compounds, catalysts, etc.) be not present, or present in such minute quantities that they do not generate enough corrosive, reactive or deleterious effect to damage a component or effect their reliability over a desired period of time (years, months, days, for example). For such circuit articles, it is preferred that such undesirable materials be present at a concentration less than 3000 ppm, more preferably less than 300 ppm, even more preferably less than 30 ppm, and most preferably less than 0.03 ppm.

In addition, some circuit articles require careful selection and placement of the vibration damping material layer(s) to ensure proper adhesion to the circuit article over temperature and humidity changes (−40 to 150 degrees C. and 5 percent to 95 percent relative humidity, for example). The circuit article's surface may also not be as clean as desired and a vibration damping material may need to have an ability to displace and/or absorb residues on the surface of the circuit article to make or allow a sufficient bonding to the surface to occur. If the vibration damping material is not properly designed for the surface contamination (e.g., remaining from cleaning processes and/or soldering processes added during manufacturing of the circuit article, etc.,) remaining on the circuit article and/or temperature and humidity changes, the VDSM could potentially delaminate and either fall off the circuit article or reduce the effect of the VDSM in adding damping and/or stiffness to the circuit article. The useful adhesion is typically greater than about 0.2 lb./inch (1,378 Pascals), preferably greater than about 2 lb./inch (13,788 Pascals), more preferably greater than about 5 lb./inch (34,470 Pascals), and most preferably greater than about 12 lb./inch (82,728 Pascals), for a 180 degree peel test from the surface of the circuit article that the VDSM will be used on, with a peel rate of 12 inches per minute (30 cm per minute) and with a test backing suitable for a 180 degree peel test, such as 0.001 to 0.002 inch (0.0254 mm to 0.051 mm) thick polyester film, aluminum, stainless steel, etc. and a dwell time before testing of 72 hours with the test sample conditioned at 20–25 degrees C. and 30–70 percent relative humidity prior to testing. The VDSM should be attached with the required heat, time and pressure to achieve the desired initial bond characteristics.

Intermediate Connecting Member

As mentioned previously the VDSM optionally comprises an intermediate connecting member. The VDSM, rather than being directly attached to the circuit article, may be attached via its vibration damping material layer(s) to an intermediate connecting member (also referred to herein as a "stand-off member"), the intermediate connecting member being attached also to the circuit article. The vibration damping material layer(s) of the VDSM may be capable of adhering to the intermediate connecting member if the vibration damping material layer(s) have adhesive properties. An adhesive layer(s), however, may optionally be used to adhere the VDSM via its vibration damping material layer(s) to the intermediate connecting member. Other methods of attaching the vibration damping materials layer(s) to the intermediate connecting member are also foreseen.

The stand-off member changes the location of the neutral axis of the vibration damping and stiffening member's vibration damping material layer(s) and can improve the shearing and/or compression and/or tension deformation of the vibration damping material layer(s) thereby increasing the effectiveness of the VDSM in dissipating vibration or shock energy. The stand-off member has a higher Young's modulus than the vibration damping material layer(s) of the VDSM. The stand-off member comprises at least one material (typically in the form of a layer) having a higher Young's modulus than the vibration damping material layer(s) of the VDSM. Examples of such high Young's modulus materials include but are not limited to those selected from the group consisting of syntactic foam, fiber or particulate re-enforced epoxy materials, polycarbonate, polysulfone, polyester, polyimide, stainless steel, aluminum, etc. The stand-off member may, for example, comprise one or more layers of the aforementioned materials. Any suitable material that has a higher Young's modulus than the vibration damping material layer(s) of the VDSM and that can transfer strain energy into the vibration damping material layer(s) of the VDSM can be used. The stand-off member may be attached to the circuit article by various means, such as by adhesives (such as epoxies, acrylates, etc.), mechanical fasteners, welding, etc.

The stand-off member can have various geometric designs. For example, it may have a rectangular shape when viewed from above and in cross-section. Frequently it has a similar top view as the base of the VDSM. It may optionally contain slits, holes, cut-outs, embossing, cross hatching, and/or impressions, etc.

As mentioned previously, the stand-off member may comprise, for example, single or multiple layers of high modulus material. When multiple layers are present they may be directly bonded to each other by an adhesive, for example.

The dimensions of the stand-off member can vary, but it typically has a length and width at least as great as the length and width of the constraining member and vibration damping material layer(s) in order to facilitate attachment to the circuit article. The average thickness of the stand off member can vary but it is typically about 0.2 to about 25 times the average thickness of the base of the VDSM. Typically the thickness of the stand-off member is constant. For a typical application the stand-off member may have a thickness of about 0.12 mm to about 25 mm, more typically about 0.25 to about 10 mm, and most typically about 0.25 to about 8 mm. Typically, the intermediate connecting member's thickness will be constant rather than vary.

The article of the present invention will be better understood by reference to the following figures.

FIG. 1 is a schematic end view of an embodiment of the vibration damped and stiffened circuit article of the present invention wherein only a portion of the circuit article is shown. The constraining member is "L" shaped. The constraining member which comprises base 2 and projection 7 is attached to circuit article 8 via vibration damping material layer 4.

Figure 2:
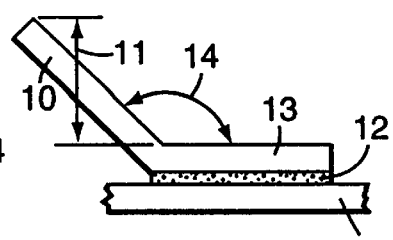
FIG. 2 is a schematic end view of another embodiment of the vibration damped and stiffened circuit article of the present invention wherein only a portion of the circuit article is shown.

FIG. 2 is a schematic end view of another embodiment of the vibration damped and stiffened circuit article of the present invention wherein only a portion of the circuit article is shown. The constraining member has a wide angle 14 (greater than 90 degrees) "L" shape. The constraining member which comprises base 13 and projection 10 is attached to circuit article 16 via vibration damping material layer 12. The height of the projection 10 is identified as 11.

Figure 3:
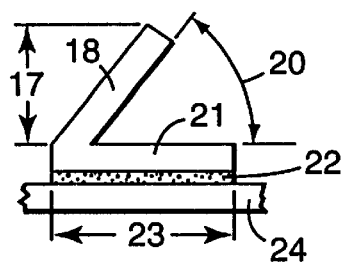
FIG. 3 is a schematic end view of another embodiment of the vibration damped and stiffened circuit article of the present invention wherein only a portion of the circuit article is shown.

FIG. 3 is a schematic end view of another embodiment of the vibration damped and stiffened circuit article of the present invention wherein only a portion of the circuit article is shown. The constraining member has a low angle 20 (less than 90 degrees) "L" shape. The constraining member which comprises base 21 and projection 18 is attached to circuit article 24 via vibration damping material layer 22.

Figure 4:
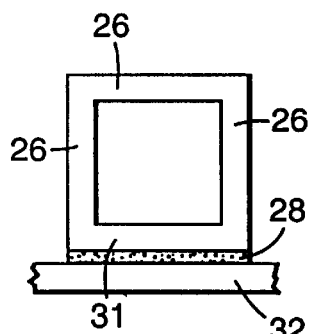
FIG. 4 is a schematic end view of another embodiment of the vibration damped and stiffened circuit article of the present invention wherein only a portion of the circuit article is shown.

FIG. 4 is a schematic end view of another embodiment of the vibration damped and stiffened circuit article of the present invention wherein only a portion of the circuit article is shown. The constraining member has a hollow rectangular box (angular "O") shape. The constraining member which comprises base 31 and projection 26 is attached to circuit article 32 via vibration damping material layer 28.

Figure 5:
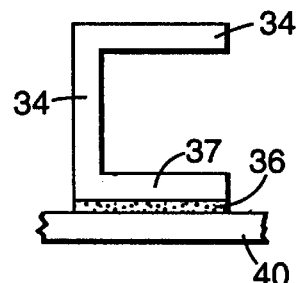
FIG. 5 is a schematic end view of another embodiment of the vibration damped and stiffened circuit article of the present invention wherein only a portion of the circuit article is shown.

FIG. 5 is a schematic end view of another embodiment of the vibration damped and stiffened circuit article of the present invention wherein only a portion of the circuit article is shown. The constraining member has a ¾ hollow rectangular box (angular "C") shape. The constraining member which comprises base 37 and projection 34 is attached to circuit article 40 via vibration damping material layer 36.

Figure 6:
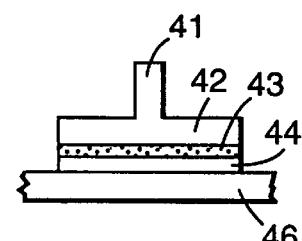
FIG. 6 is a schematic end view of another embodiment of the vibration damped and stiffened circuit article of the present invention wherein only a portion of the circuit article is shown.

FIG. 6 is a schematic end view of another embodiment of the vibration damped and stiffened circuit article of the present invention wherein only a portion of the circuit article is shown. The constraining member has an upside down "T" shape. The constraining member which comprises base 42 and projection 41 is attached to circuit article 46 via vibration damping material layers 43 and 44.

Figure 7:
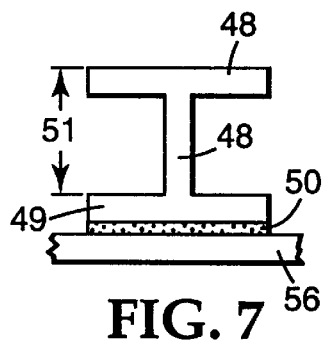
FIG. 7 is a schematic end view of another embodiment of the vibration damped and stiffened circuit article of the present invention wherein only a portion of the circuit article is shown.

FIG. 7 is a schematic end view of another embodiment of the vibration damped and stiffened circuit article of the present invention wherein only a portion of the circuit article is shown. The constraining member has an "I" shape. The constraining member which comprises base 49 and projection 48 is attached to circuit article 56 via vibration damping material layer 50. The height of the projection 48 is identified as 51.

Figure 8:
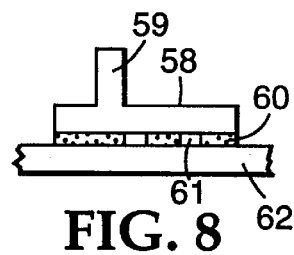
FIG. 8 is a schematic end view of another embodiment of the vibration damped and stiffened circuit article of the present invention wherein only a portion of the circuit article is shown.

FIG. 8 is a schematic end view of another embodiment of the vibration damped and stiffened circuit article of the present invention wherein only a portion of the circuit article is shown. The constraining member includes an off-center projection that is perpendicular to the base. The constraining member which comprises base 58 and projection 59 is attached to circuit article 62 via discontinuous vibration damping material layer 60. Spaces 61 are also shown.

Figure 9:
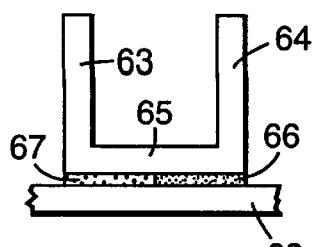
FIG. 9 is a schematic end view of another embodiment of the vibration damped and stiffened circuit article of the present invention wherein only a portion of the circuit article is shown.

FIG. 9 is a schematic end view of another embodiment of the vibration damped and stiffened circuit article of the present invention wherein only a portion of the circuit article is shown. The constraining member has an angular "U" shape. The constraining member which comprises base 65 and projections 63 and 64 is attached to circuit article 68 via adjacent vibration damping material layers 67 and 66.

Figure 10:
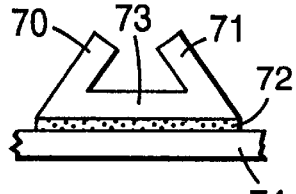
FIG. 10 is a schematic end view of another embodiment of the vibration damped and stiffened circuit article of the present invention wherein only a portion of the circuit article is shown.

FIG. 10 is a schematic end view of another embodiment of the vibration damped and stiffened circuit article of the present invention wherein only a portion of the circuit article is shown. The constraining member has a low angle (less than 90 degrees) angular "U" shaped design. The constraining member which comprises base 73 and projections 70 and 71 is attached to circuit article 74 via vibration damping material layer 72.

Figure 11:
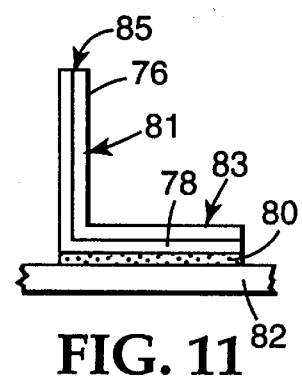
FIG. 11 is a schematic end view of another embodiment of the vibration damped and stiffened circuit article of the present invention wherein only a portion of the circuit article is shown.

FIG. 11 is a schematic end view of another embodiment of the vibration damped and stiffened circuit article of the present invention wherein only a portion of the circuit article is shown. The constraining member has an "L" shape and is formed from two separate layers of high modulus material (76 and 78) joined by a thin layer of vibration damping material 85. The constraining member which comprises base 83 and projection 81 is attached to circuit article 82 via vibration damping material layer 80.

Figure 12:
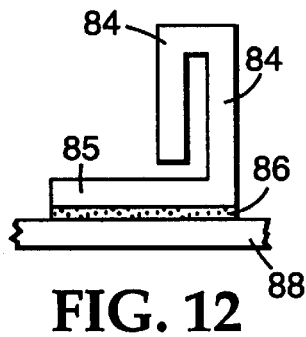
FIG. 12 is a schematic end view of another embodiment of the vibration damped and stiffened circuit article of the present invention wherein only a portion of the circuit article is shown.

FIG. 12 is a schematic end view of another embodiment of the vibration damped and stiffened circuit article of the present invention wherein only a portion of the circuit article is shown. The constraining member has a reverse "L" shape with a folded down projection. The projection extends away from the base and then back towards the base. The constraining member which comprises base 85 and projection 84 is attached to circuit article 88 via vibration damping material layer 86.

Figure 13:
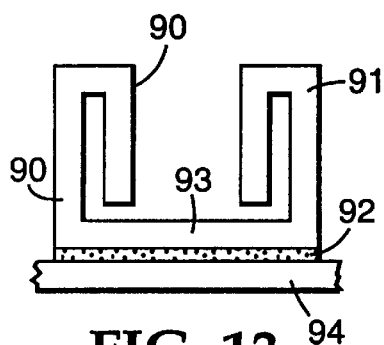
FIG. 13 is a schematic end view of another embodiment of the vibration damped and stiffened circuit article of the present invention wherein only a portion of the circuit article is shown.

FIG. 13 is a schematic end view of another embodiment of the vibration damped and stiffened circuit article of the present invention wherein only a portion of the circuit article is shown. The constraining member has a reverse "L" shape with two folded down projections. The constraining member which comprises base 93 and projections 90 and 91 is attached to circuit article 94 via vibration damping material layer 92, wherein projection 90 is of a different material than base 93 and is attached to base 93 with an adhesive (not shown).

Figure 14:
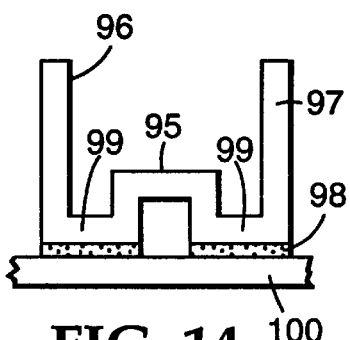
FIG. 14 is a schematic end view of another embodiment of the vibration damped and stiffened circuit article of the present invention wherein only a portion of the circuit article is shown.

FIG. 14 is a schematic end view of another embodiment of the vibration damped and stiffened circuit article of the present invention wherein only a portion of the circuit article is shown. The constraining member has a reverse dual "L" shape. The constraining member which comprises base 99 and projections 96, 97, and 95 are attached to circuit article 100 via vibration damping material layer 98.

Figure 15:
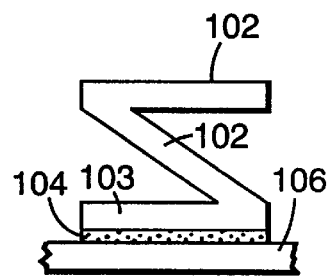
FIG. 15 is a schematic end view of another embodiment of the vibration damped and stiffened circuit article of the present invention wherein only a portion of the circuit article is shown.

FIG. 15 is a schematic end view of another embodiment of the vibration damped and stiffened circuit article of the present invention wherein only a portion of the circuit article is shown. The constraining member has a reverse "Z" shape. The constraining member which comprises base 103 and projection 102 is attached to circuit article 106 via vibration damping material layer 104.

Figure 16:
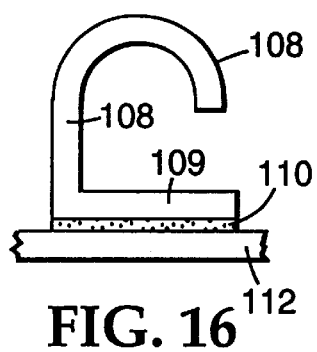
FIG. 16 is a schematic end view of another embodiment of the vibration damped and stiffened circuit article of the present invention wherein only a portion of the circuit article is shown.

FIG. 16 is a schematic end view of another embodiment of the vibration damped and stiffened circuit article of the present invention wherein only a portion of the circuit article is shown. The constraining member is of an "L" shaped design with a curved projection. The constraining member which comprises base 109 and projection 108 is attached to circuit article 112 via vibration damping material layer 110.

Figure 17:
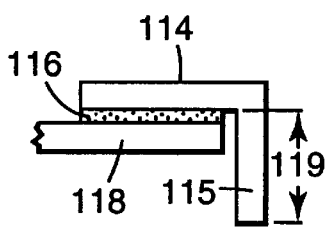
FIG. 17 is a schematic end view of another embodiment of the vibration damped and stiffened circuit article of the present invention wherein only a portion of the circuit article is shown.

FIG. 17 is a schematic end view of another embodiment of the vibration damped and stiffened circuit article of the present invention wherein only a portion of the circuit article is shown. The constraining member is of a reverse "L" shaped design wherein the vibration damping material layer is on the same said of the base as the projection and wherein the projection extends towards the circuit board and past the circuit article. The constraining member which comprises base 114 and projection 115 is attached to circuit article 118 via vibration damping material layer 116. The height of projection 115 is identified as 119.

Figure 18:
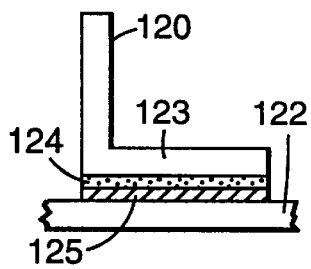
FIG. 18 is a schematic end view of another embodiment of the vibration damped and stiffened circuit article of the present invention wherein only a portion of the circuit article is shown.

FIG. 18 is a schematic end view of another embodiment of the vibration damped and stiffened circuit article of the present invention wherein only a portion of the circuit article is shown. The constraining member has an "L" shape. The constraining member which comprises base 123 and projection 120. The vibration damping material layer 124 is bonded between the base 123 of the constraining member and stand-off member 125. Stand-off member 125 is attached directly to circuit article 122 via an adhesive layer (not shown).

Figure 19:
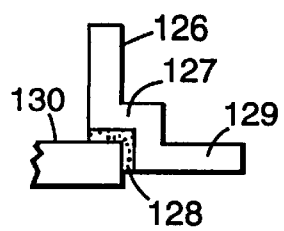
FIG. 19 is a schematic end view of another embodiment of the vibration damped and stiffened circuit article of the present invention wherein only a portion of the circuit article is shown.

FIG. 19 is a schematic end view of another embodiment of the vibration damped and stiffened circuit article of the present invention wherein only a portion of the circuit article is shown. The constraining member which comprises base 127 and projections 126 and 129 is attached to circuit article 130 via vibration damping material layer 128.

Figure 20:
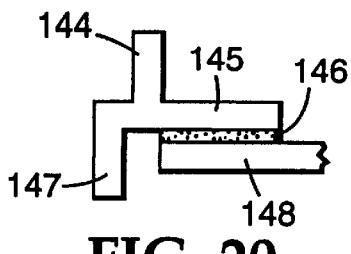
FIG. 20 is a schematic end view of another embodiment of the vibration damped and stiffened circuit article of the present invention wherein only a portion of the circuit article is shown.

FIG. 20 is a schematic end view of another embodiment of the vibration damped and stiffened circuit article of the present invention wherein only a portion of the circuit article is shown. The constraining member which comprises base 145 and projections 144 and 147 is attached to circuit article 148 via vibration damping material layer 146. Part of the base 145 is positioned over the circuit article 148 and part extends past the circuit article 148. Only a portion of the base 145 lower surface is coated with vibration damping material. Projection 144 extends from an perpendicular to the upper surface of the base 145. Projection 147 extends from and is perpendicular to the lower surface of the base 145.

Figure 21:
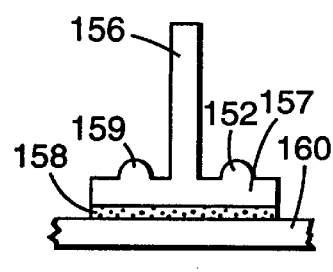
FIG. 21 is a schematic end view of another embodiment of the vibration damped and stiffened circuit article of the present invention wherein only a portion of the circuit article is shown.

FIG. 21 is a schematic end view of another embodiment of the vibration damped and stiffened circuit article of the present invention wherein only a portion of the circuit article is shown. The constraining member which comprises base 157 and projections 156, 159 and 152 is attached to circuit article 160 via vibration damping material layer 158. The taller central projection 156 has a rectangular cross-section, whereas the smaller projections 159 and 152 on either side have projections with cross-sections shaped liked semicircles.

Figure 22:
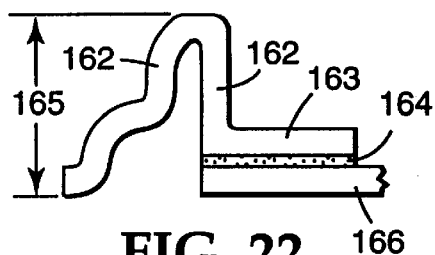
FIG. 22 is a schematic end view of another embodiment of the vibration damped and stiffened circuit article of the present invention wherein only a portion of the circuit article is shown.

FIG. 22 is a schematic end view of another embodiment of the vibration damped and stiffened circuit article of the present invention wherein only a portion of the circuit article is shown. The constraining member which comprises base 163 and projection 162 is attached to circuit article 166 via vibration damping material layer 164. The height of the projection 162 is identified as 165.

Figure 23:
FIG. 23 is a schematic end view of another embodiment of the vibration damped and stiffened circuit article of the present invention wherein only a portion of the circuit article is shown.

FIG. 23 is a schematic end view of another embodiment of the vibration damped and stiffened circuit article of the present invention wherein only a portion of the circuit article is shown. The constraining member which comprises base 169 and projection 168 is attached to circuit article 172 via vibration damping material layer 170. Projection 168 has a somewhat expanded "M" shape. The height of the projection 168 is identified as 171.

Figure 24:
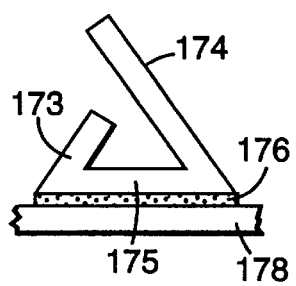
FIG. 24 is a schematic end view of another embodiment of the vibration damped and stiffened circuit article of the present invention wherein only a portion of the circuit article is shown.

FIG. 24 is a schematic end view of another embodiment of the vibration damped and stiffened circuit article of the present invention wherein only a portion of the circuit article is shown. The constraining member which comprises base 175 and projections 173 and 174 is attached to circuit article 178 via vibration damping material layer 176. The constraining member has a somewhat modified angular "U" shape, wherein one projection is greater in length than the other and both projections form angles less than 90 degrees with the base.

Figure 25:
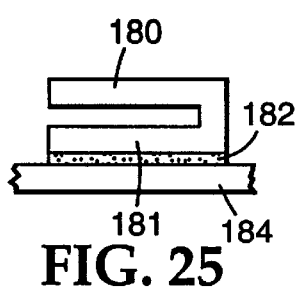
FIG. 25 is a schematic end view of another embodiment of the vibration damped and stiffened circuit article of the present invention wherein only a portion of the circuit article is shown.

FIG. 25 is a schematic end view of another embodiment of the vibration damped and stiffened circuit article of the present invention wherein only a portion of the circuit article is shown. The constraining member which comprises base 181 and projection 180 is attached to circuit article 184 via vibration damping material layer 182. The constraining member has a compressed angular "C" shape.

Figure 26:
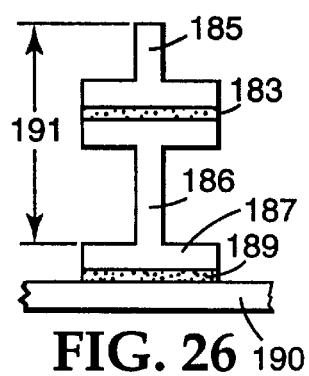
FIG. 26 is a schematic end view of another embodiment of the vibration damped and stiffened circuit article of the present invention wherein only a portion of the circuit article is shown.

FIG. 26 is a schematic end view of another embodiment of the vibration damped and stiffened circuit article of the present invention wherein only a portion of the circuit article is shown. The constraining member which comprises base 187 and projection 186 is attached to circuit article 190 via vibration damping material layer 189. The projection has a modified plus sign shape. The projection 186 of the constraining member contains an inner layer of vibration damping material identified as 183. The portion of the projection 186 labeled 185 is of a different material than the remainder of the projection 186. The height of the projection 186 is identified as 191.

Figure 27:
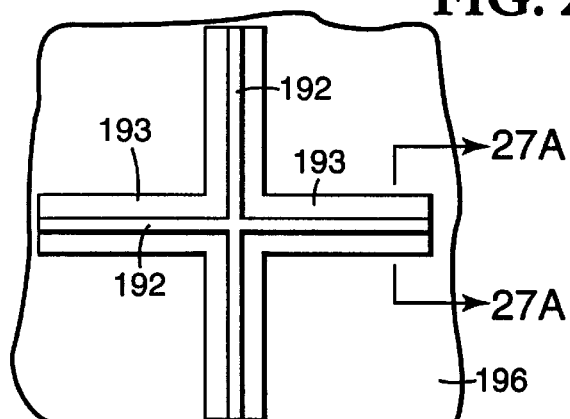
FIG. 27 is a schematic top plan view of another embodiment of the vibration damped and stiffened circuit article of the present invention wherein only a portion of the circuit article is shown.

FIG. 27 is a schematic top plan view of another embodiment of the vibration damped and stiffened circuit article of the present invention wherein only a portion of the circuit article is shown. The constraining member which comprises base 193 and projection 192 is attached to circuit article 196 via vibration damping material layer 194 (not shown). The constraining member has a cross-sectional upside down "T" shape.

Figure 27A:
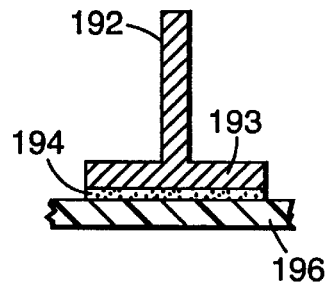
FIG. 27A is a schematic of a cross-sectional view of the embodiment of the vibration damped and stiffened circuit article of the present invention of FIG. 27 taken along line 27A—27A wherein only a portion of the circuit article is shown.

FIG. 27A is a schematic of a cross-sectional view of the embodiment of the vibration damped and stiffened circuit article of the present invention of FIG. 27 taken along line 27A—27A wherein only a portion of the circuit article is shown. The constraining member which comprises base 193 and projection 192 is attached to circuit article 196 via vibration damping material layer 194.

Figure 28:
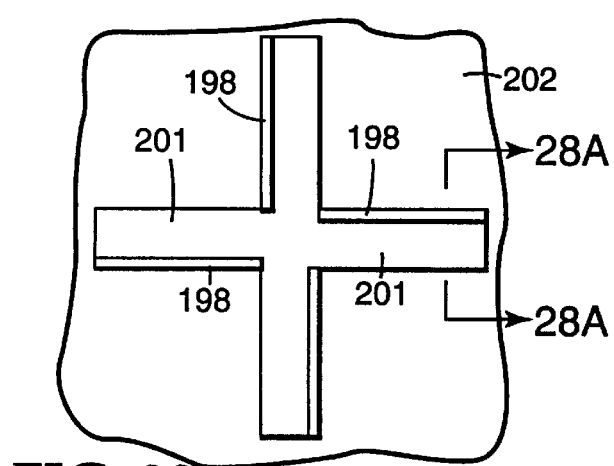
FIG. 28 is a schematic top plan view of another embodiment of the vibration damped and stiffened circuit article of the present invention wherein only a portion of the circuit article is shown.

FIG. 28 is a schematic top plan view of another embodiment of the vibration damped and stiffened circuit article of the present invention wherein only a portion of the circuit article is shown. The constraining member which comprises base 201 and projection 198 is attached to circuit article 202 via vibration damping material layer 200 (not shown). The VDSM when viewed from above has a plus sign (+) shape.

Figure 28A:
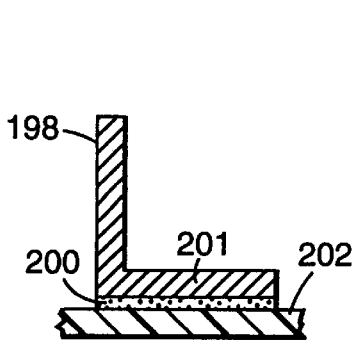
FIG. 28A is a schematic of a cross-sectional view of the embodiment of the vibration damped and stiffened circuit article of the present invention of FIG. 28 taken along line 28A—28A wherein only a portion of the circuit article is shown.

FIG. 28A is a schematic of a cross-sectional view of the embodiment of the vibration damped and stiffened circuit article of the present invention of FIG. 28 taken along line 28A—28A, wherein only a portion of the circuit article is shown. The constraining member which comprises base 201 and projection 198 is attached to circuit article 202 via vibration damping material layer 200. The constraining member has a cross-sectional "L" shape.

Figure 29:
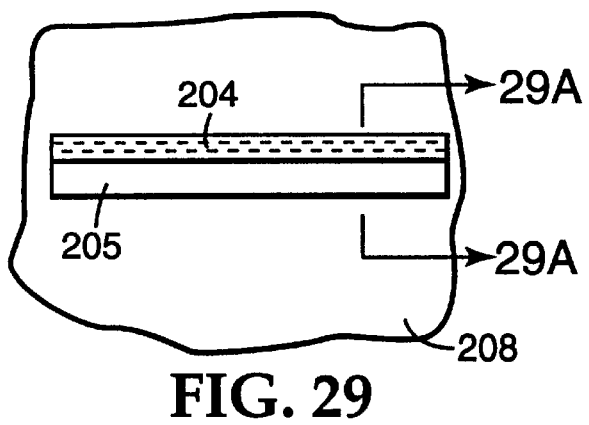
FIG. 29 is a schematic top plan view of another embodiment of the vibration damped and stiffened circuit article of the present invention wherein only a portion of the circuit article is shown.

FIG. 29 is a schematic top plan view of another embodiment of the vibration damped and stiffened circuit article of the present invention wherein only a portion of the circuit article 208 is shown. The constraining member which comprises base 205 and projection 204 is attached to circuit article 208 via vibration damping material layer 206 (not shown). The VDSM when viewed from above has a thin rectangular shape.

Figure 29A:
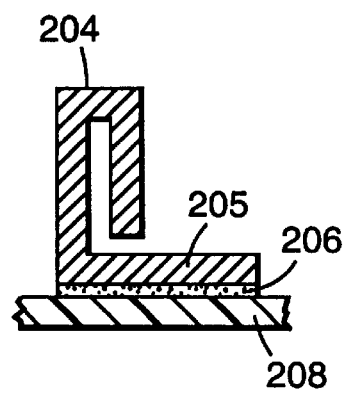
FIG. 29A is a schematic of a cross-sectional view of the embodiment of the vibration damped and stiffened circuit article of the present invention of FIG. 29 taken along line 29A—29A wherein only a portion of the circuit article is shown.

FIG. 29A is a schematic of a cross-sectional view of the embodiment of the vibration damped and stiffened circuit article of the present invention of FIG. 29 taken along line 29A—29A wherein only a portion of the circuit article is shown. The constraining member which comprises base 205 and projection 204 is attached to circuit article 208 via vibration damping material layer 206. The projection when viewed in cross-section has a modified angular "U" shape with one side longer than the other.

Figure 30:
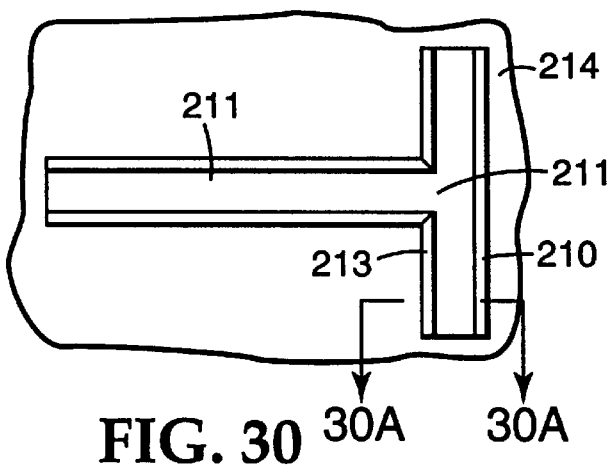
FIG. 30 is a schematic top plan view of another embodiment of the vibration damped and stiffened circuit article of the present invention wherein only a portion of the circuit article is shown.

FIG. 30 is a schematic top plan view of another embodiment of the vibration damped and stiffened circuit article of the present invention wherein only a portion of the circuit article 214 is shown. The constraining member which comprises base 211 and projections 210 and 213 is attached to circuit article 214 via vibration damping material layer 212 (not shown). The VDSM when viewed from above has a "T" shape.

Figure 30A:
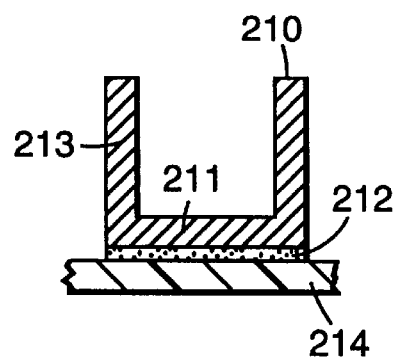
FIG. 30A is a schematic of a cross-sectional view of the embodiment of the vibration damped and stiffened circuit article of the present invention of FIG. 30 taken along line 30A—30A wherein only a portion of the circuit article is shown.

FIG. 30A is a schematic of a cross-sectional view of the embodiment of the vibration damped and stiffened circuit article of the present invention of FIG. 30 taken along line 30A—30A wherein only a portion of the circuit article is shown. The constraining member which comprises base 211 and projections 210 and 213 is attached to circuit article 214 via vibration damping material layer 212. The constraining member when viewed in cross-section has an angular "U" shape.

METHOD OF MAKING ARTICLES OF THE INVENTION

The damped and stiffened circuit article of the invention is made by attaching one or more VDSMs to a circuit article.

One method of making a VDSM is to laminate or bond the vibration damping material layer(s) to a higher modulus constraining member material and form the constraining member material into the desired constraining member shape, such as an "L" shape, for example. Alternatively, a VDSM can be made by pre-forming the constraining member and bonding a layer(s) of vibration damping material thereto. Alternatively, a vibration damping material layer(s) could be bonded to a base, which base could be subsequently attached (bonded with an adhesive such as an acrylate or epoxy, mechanically fastened, etc.) to the projection(s). Other methods of making the VDSM(s) are also possible.

The vibration damping and stiffening member(s) is attached to the circuit article in an area(s) of the circuit article where a damping and/or shock isolation and/or stiffening benefit can be achieved. The vibration damping and stiffening member(s) can be attached to a circuit article via its vibration damping material layer(s) (if of sufficient adhesive character) or via an adhesive or via mechanical fasteners such as pins, clips, etc. As mentioned previously a stand-off member can modify the mechanical forces or strain energy entering the vibration damping material layer(s) by shifting the neutral axis of the vibration damping and stiffener member. The vibration and damping and stiffening member can be designed even in the absence of a stand-off member in a manner to affect the neutral axis and modify the amount of strain energy entering the vibration damping material layer(s). It is desirable that the vibration damping and stiffening member with or without the stand-off member be designed to optimize the strain energy entering the vibration damping material layer(s).

EXAMPLES

The invention has been described with reference to various specific and preferred embodiments and will be further described by reference to the following detailed examples. It is understood, however, that there are many extensions, variations, and modifications on the basic theme of the present invention beyond that shown in the examples and detailed description, which are within the spirit and scope of the present invention. All parts, percentages, ratios, etc. in the Examples and the rest of the specification are by weight unless indicated otherwise.

Description of Sample

For the purpose of demonstrating the invention, an FR-4 type circuit board was used. The FR-4 circuit board was approximately 0.064 inches (1.63 mm) thick by 13.25 inches (336.5 mm) long by 6.75 inches (171.5 mm) wide. The circuit board had various components attached thereto such as processors, resistors, capacitors, etc. These various components were on both sides of the circuit board.

Example 1

Two VDSMs were separately made and attached to an FR-4 circuit board. The first vibration damping and stiffening member used to damp and stiffen the circuit board was made as follows. A constraining member was made from a flat aluminum sheet having a length of 11.5 inches (292 mm) and a thickness of 0.040 inch (1.02 mm). The aluminum sheet was bent along its length to form a constraining member having a cross-sectional somewhat modified "L" shape (a base with a slightly less than perpendicular projection). The angle between the base and projection of the "L" design was between 75 and 85 degrees. The constraining member was formed by placing the flat aluminum sheet in a hand forming press and bending the metal to between 75 and 85 degrees to form the somewhat L-shaped constraining member having a base and a projection. The dimensions of the constraining member of the vibration damping and stiffening member were as follows: The base had a length of 11.5 inches (292 mm), a width of 0.25 inch (6.35 mm), and a thickness of 0.040 inch (1.02 mm). The projection had a length of 11.5 inches (292 mm), a width of 0.44 inch (11.8 mm), a thickness of 0.040 inches (1.02 mm), and a height of 0.39 inches (10 mm). The constraining member was similar to that shown in FIG. 3. In FIG. 3, the height of the projection 18 is identified as 17, and the width of the base 21 is identified as 23.

A layer of vibration damping material was added to the lower surface of the base (the side of the base opposite the projection). The vibration damping material layer was 0.020 inches (0.51 mm) thick and had the same length and width of the base. The vibration damping material used was an acrylic polymer that had a loss factor greater than 0.5 for a broad frequency range (±1000 Hz) at the desired test temperature (20° C./72° F.). The vibration damping polymer selected was 3M Brand ISD-112 vibration damping polymer, available from Minnesota Mining and Manufacturing Company, St. Paul, Minn.

A second VDSM was prepared according to the same procedure used in preparing the first VDSM except that the length of the aluminum material and the length of the base and projection of the resulting constraining member were all 6.4 inches (162.6 mm) rather than 11.5 inches (292 mm).

The two VDSMs were attached to the circuit board: by removing the protective liner from the ISD-112 vibration damping polymer and attaching the damper to the circuit article with moderate pressure (1–10 psi, $6.9 \times 10^3$ Pascals to $6.9 \times 10^4$ Pascals) for 3–10 seconds at the prescribed location.

The 292 mm long first VDSM was applied parallel to a side edge of the circuit board along its 336 mm long edge. The first VDSM was attached approximately 2 to 10 mm from the edge of the circuit board, evenly spaced from each end. The VDSM was positioned such that the vibration damping material was in contact with the circuit article.

The second VDSM was attached to circuit board perpendicular to the 292 mm long VDSM in an area 550 mm from the center of the circuit board along the 336 mm edge. The VDSM was positioned such that the vibration damping material was in contact with the circuit article.

Comparative Example 2

Circuit Board Free of Dampers and Stiffeners

This comparative example used the initial FR-4 circuit board having no damping or stiffening devices attached. This circuit board was used to demonstrate baseline performance with no added damping or stiffening.

Comparative Example 3

Circuit Board Having Conventional Flat Constrained Layer Dampers

Two conventional flat constrained layer dampers were used to damp the FR-4 circuit board. Each flat damper had a flat aluminum constraining layer. The dimensions of the aluminum constraining layer of the first flat constrained layer damper were as follows: a thickness of 0.040 inch (1.02 mm) thick, a width of 0.25 inch (6.35 mm), and a length of 11.5 inch (292 mm).

A vibration damping material layer was added to a flat surface of one of the constraining layer's sides. The vibration damping material layer was 0.020 inch (0.51 mm) thick. The damping material used was an acrylic polymer that had a loss factor greater than 0.5 for a broad frequency range (±1000 Hz) at the desired test temperature (20° C./72° F.). The damping polymer selected was 3M Brand ISD-112, available from Minnesota Mining and Manufacturing Company, St. Paul, Minn. The 292 mm long first damper was applied parallel to a side edge of the circuit board along its 336 mm long edge. The first damper was attached approximately 2 to 10 mm from the edge of the circuit board, evenly spaced from each end. The damper was positioned such that the vibration damping material was in contact with the circuit article.

The second flat constrained layer damper had a flat aluminum constraining layer with dimensions as follows: a thickness of 0.040 inch (1.02 mm), a width of 0.025 inch (6.35 mm), and a length of 6.4 inches (162.6 mm). The same vibration damping material at the same thickness as for the first flat constrained layer damper was applied to one side of the flat constraining layer of the second damper. The second damper flat constrained layer damper was attached to the circuit board perpendicular to the 292 mm long damper in an area 550 mm from the center of the circuit board along the 336 mm edge. The damper was positioned such that the vibration damping material was in contact with the circuit article.

Comparative Example 4

Conventional Stiffened, Non-Damped Circuit Board

Figure 35:
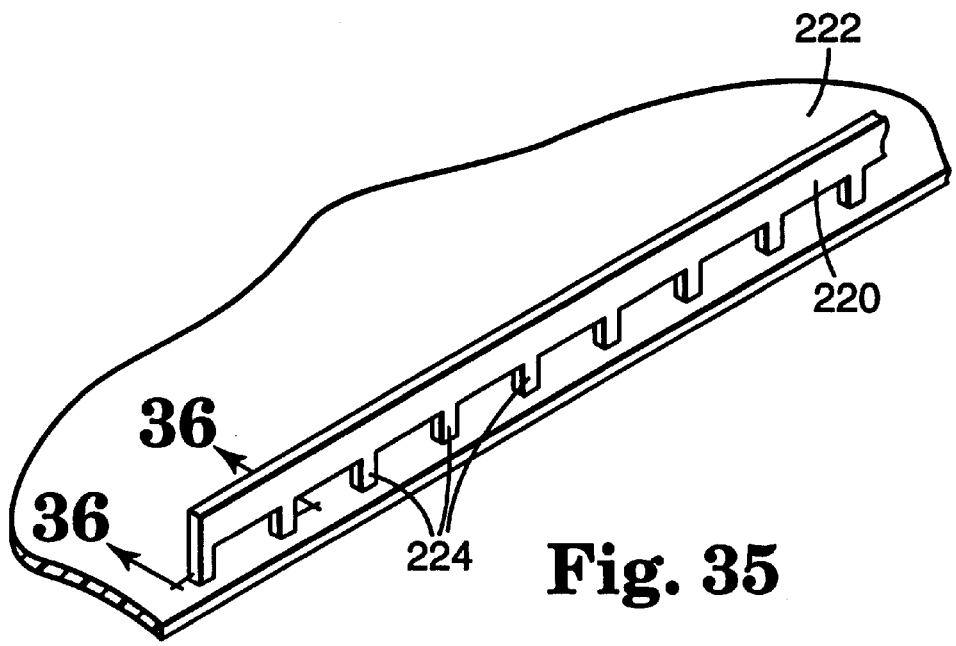
FIG. 35 is a perspective view of a schematic illustration of a circuit board having a prior art stiffener attached thereto.
Figure 36:
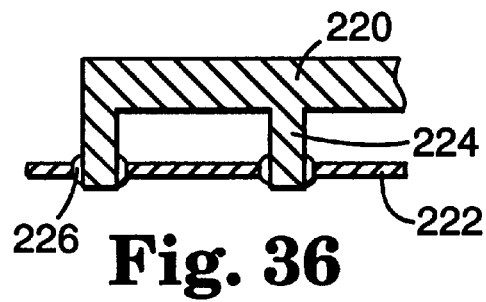
FIG. 36 is a cross-sectional view of the circuit board of FIG. 35 taken along line 36—36.

The FR-4 circuit board had two non-damped aluminum stiffeners of different lengths soldered thereto. One was soldered along the length of the circuit board and the other across the middle of the circuit board. The stiffeners were 0.030 inches (0.762 mm) thick somewhat rectangular shaped pieces of aluminum. The aluminum stiffeners had small extensions or legs spaced about 1.0 inch (25.4 mm) apart that extended perpendicular to the length of the stiffeners. Each leg was about 0.050–0.2 inches wide (1.27 mm to 5.1 mm). The legs of the stiffeners were soldered to the circuit boards with the main portion of the stiffener above the circuit board surface. The extensions fit into holes drilled into the circuit board. The first stiffener was 11.2 inches (284 mm) long with a height (excluding the legs) of 0.28 inch (7 mm). The second stiffener was 6.2 inches (157 mm) long with a height (excluding the legs) of 0.28 inch (7 mm). The 284 mm long stiffener was soldered parallel to the circuit board along its 336 mm edge, about 2–10 mm from the side edge. FIG. 35 is a perspective view of a schematic illustrating such a prior art stiffener. The stiffener 220 was soldered to circuit board 222 via its legs 224. FIG. 36 shows a cross-section of stiffener 220, circuit board 222, legs 224, and solder 226. The 157 mm long stiffener was soldered perpendicular to the 284 mm stiffener, at the center of the circuit board (plus or minus 50 mm).

Testing of Circuit Boards

The ability of each circuit board of Example 1 and Comparative Examples 2 to reduce vibration levels was tested by means of a damping analysis of a range of frequencies of the circuit board that could be excited by an external source. The performance of the various circuit boards tested is shown in the graphs illustrated in FIGS. 31–34.

The circuit board to be tested was placed into a chassis that supported the circuit board on three of its sides/edges.

The circuit board was locked into place with a connector that connected with the circuit board along a portion of one edge of the length of the board. An accelerometer probe was placed on the upper surface of the circuit board and the circuit board was subjected to excitation that caused the resonant frequencies of the board to be excited. The graphs in FIGS. 31 to 34 show the data generated by the tests. By using an FFT analyzer, the output analysis revealed significant increases in amplitudes at certain frequencies excited in the circuit board. These are the resonant frequencies of the circuit board.

Figure 31:
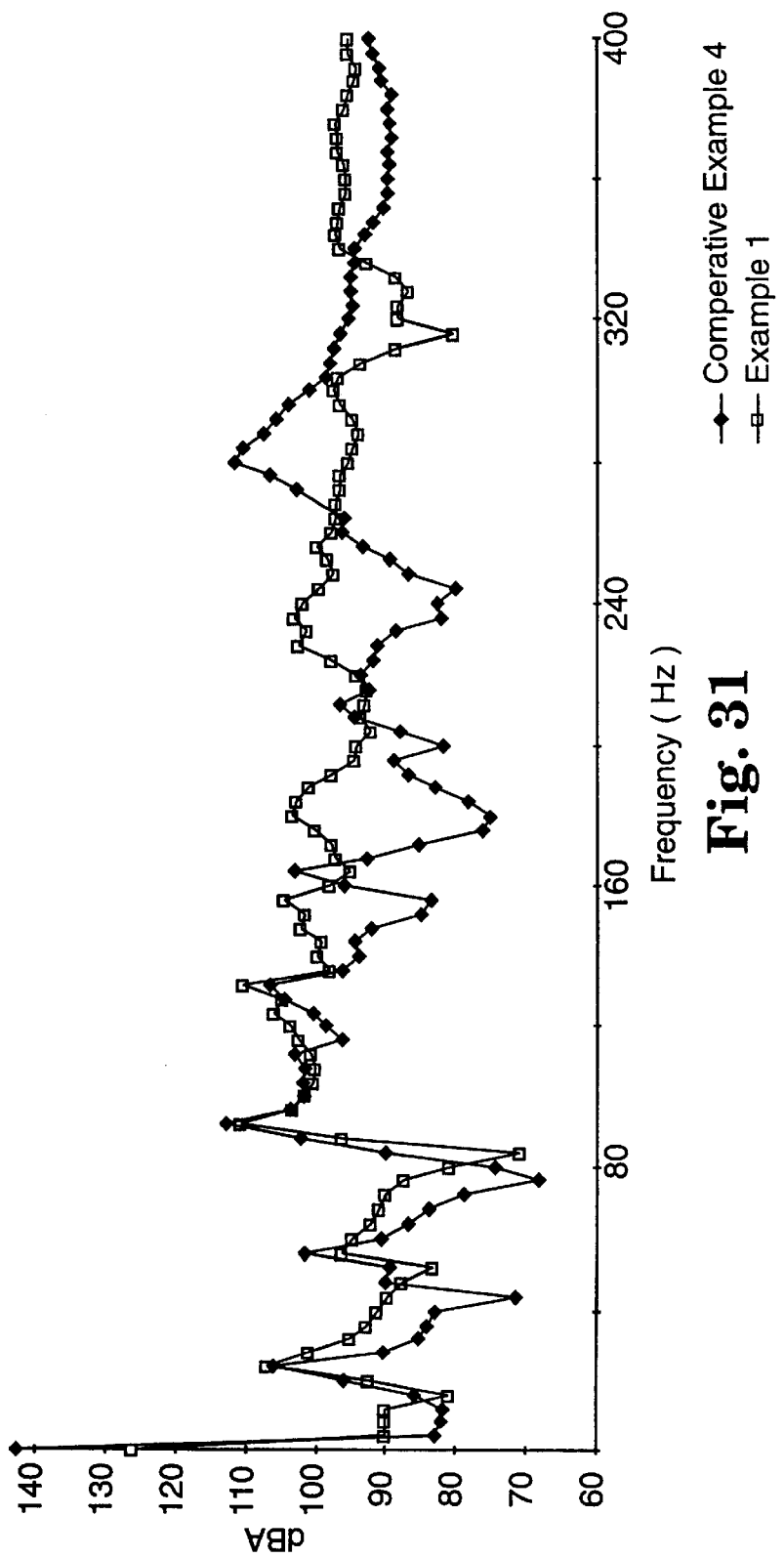
FIG. 31 is a graph illustrating frequency versus dB for the circuit boards of Example 1 and Comparative Example 4.

The graph in FIG. 31 shows the reduction in amplitudes of the circuit boards with conventional stiffeners attached (Comparative Example 4) and vibration damping and stiffening members (Example 1) attached. A comparable reduction in amplitude is demonstrated by the circuit board of the present invention having the vibration damping and stiffening members attached (Example 1) as compared to the circuit board of Comparative Example 4 for less than 400 Hz. Thus, the damped and stiffened circuit article of the invention provides at least equivalent vibration reduction to conventional circuit boards with stiffeners attached but without the inherent disadvantages of stiffeners, and at some frequencies, offers a significant improvement as is shown at about 280 Hz. This benefit is further examined for a broader frequency range in FIG. 33.

Figure 32:
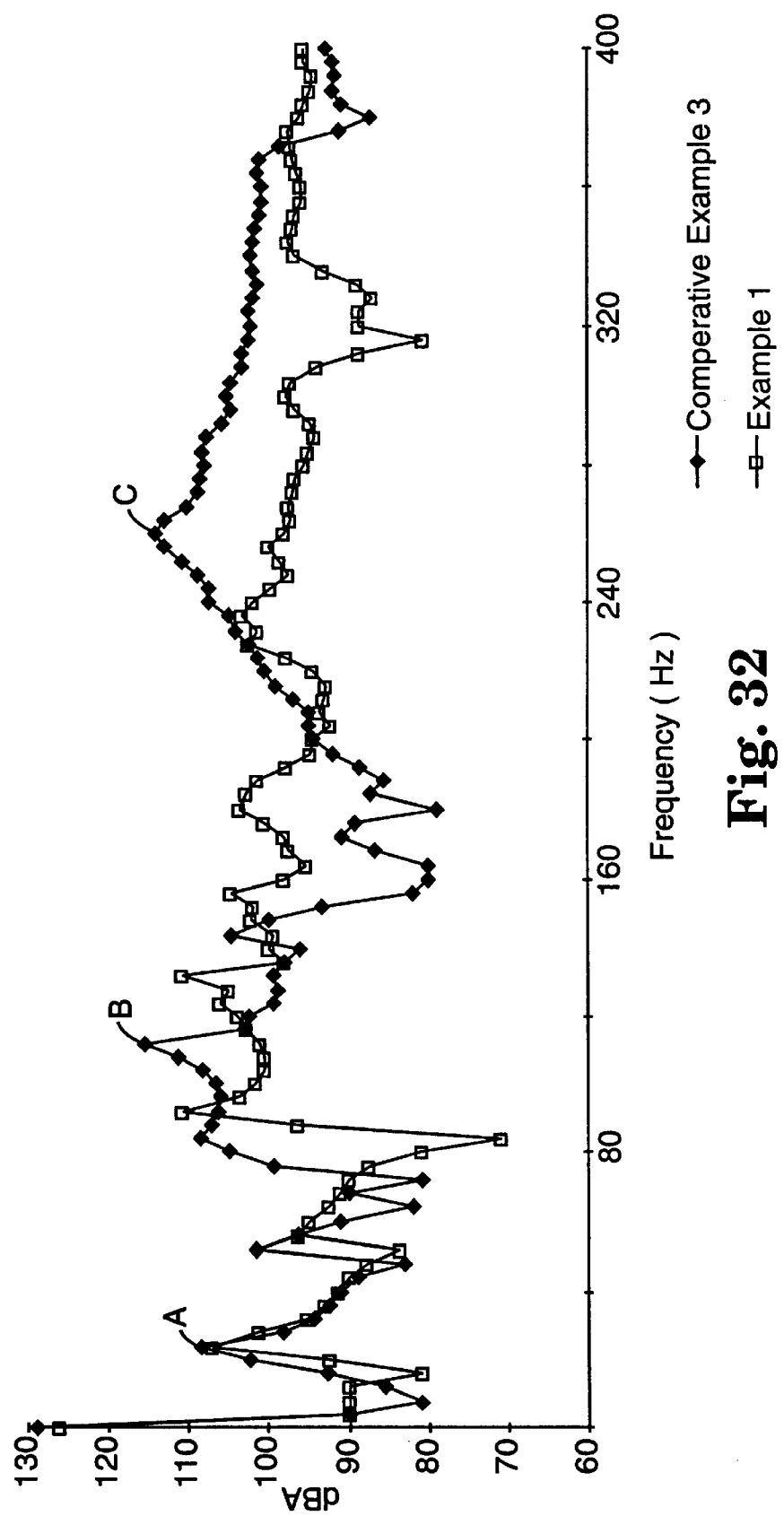
FIG. 32 is a graph illustrating frequency versus dB for the circuit boards of Comparative Example 3 and Example 1.

The graph in FIG. 32 shows the reduction in amplitudes of the circuit boards with conventional flat constrained layer dampers (Comparative Example 3) and vibration damping and stiffening members (Example 1) attached. The dampers of Comparative Example 3 and the VDSMs of Example 1 had the same attachment surface area and the same thickness (excluding the projection of the VDSM of Example 1). A good to excellent reduction in amplitude was demonstrated by the circuit board of the present invention having the vibration damping and stiffening members attached (Example 1) as compared to the circuit board of Comparative Example 3 for the three highest amplitude peaks (A, B, and C). Thus, the damped and stiffened circuit article of the invention provides improved damping compared to conventional circuit boards with flat constrained layer dampers without the inherent disadvantage of flat constrained layer dampers that require greater surface area coverage to get adequate damping. In addition, the stiffness of the circuit board of Example 1 was greater than that of the circuit board of Comparative Example 3.

Figure 33:
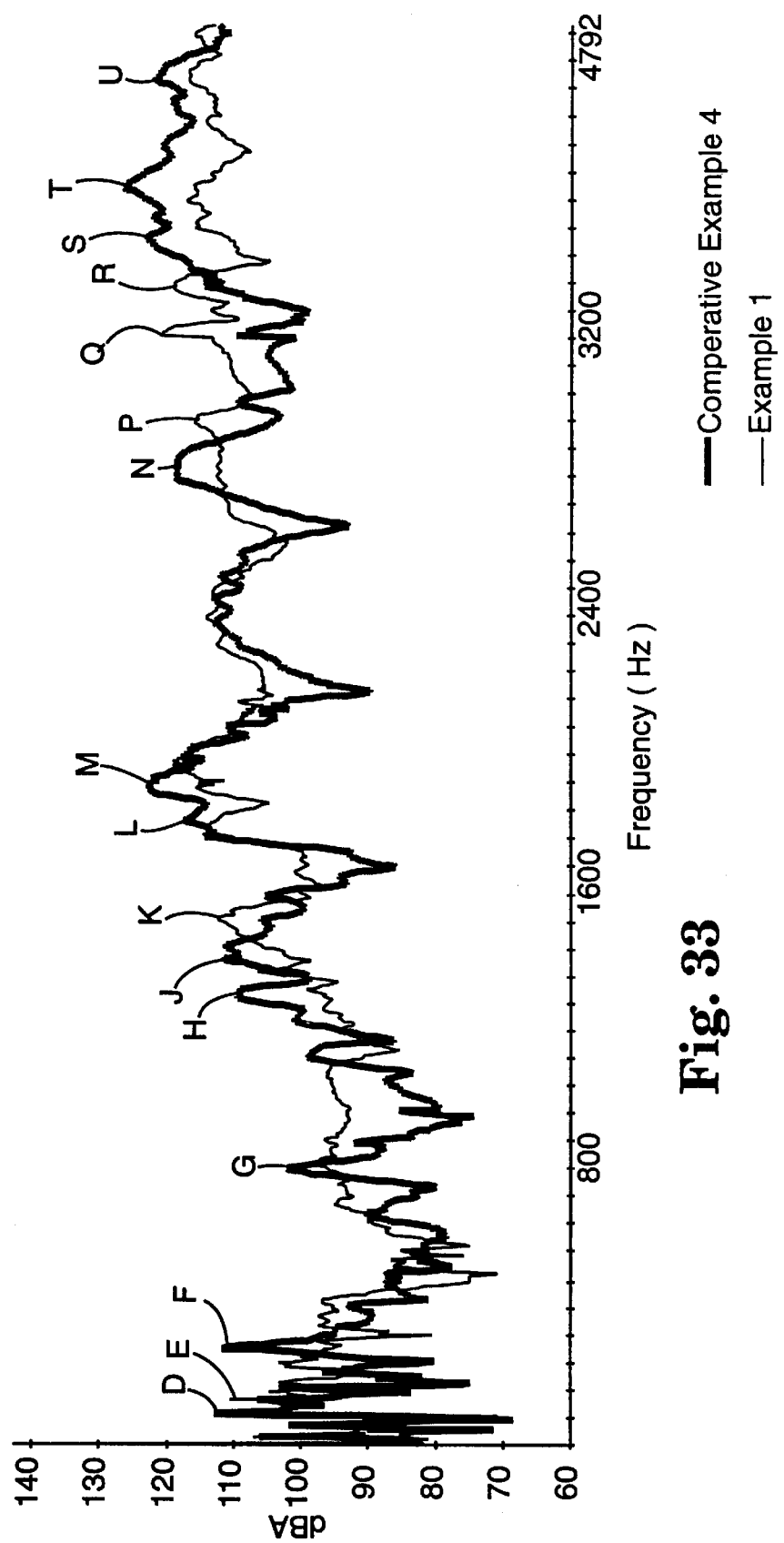
FIG. 33 is a graph illustrating frequency versus dB for the circuit board of Example 1 and Comparative Example 4.

The graph in FIG. 33 shows that the circuit board of the present invention having vibration and stiffening members attached (Example 1) is effective over a broad frequency range. The graph shows a frequency range of from 0 to about 5000. A review of peak amplitude shows that of the highest 16 peaks, only five (E, K, P, Q, and R) are associated with Example 1 showing that over a broad frequency range the vibration damping and stiffening member can improve vibration amplitude reductions.

Figure 34:
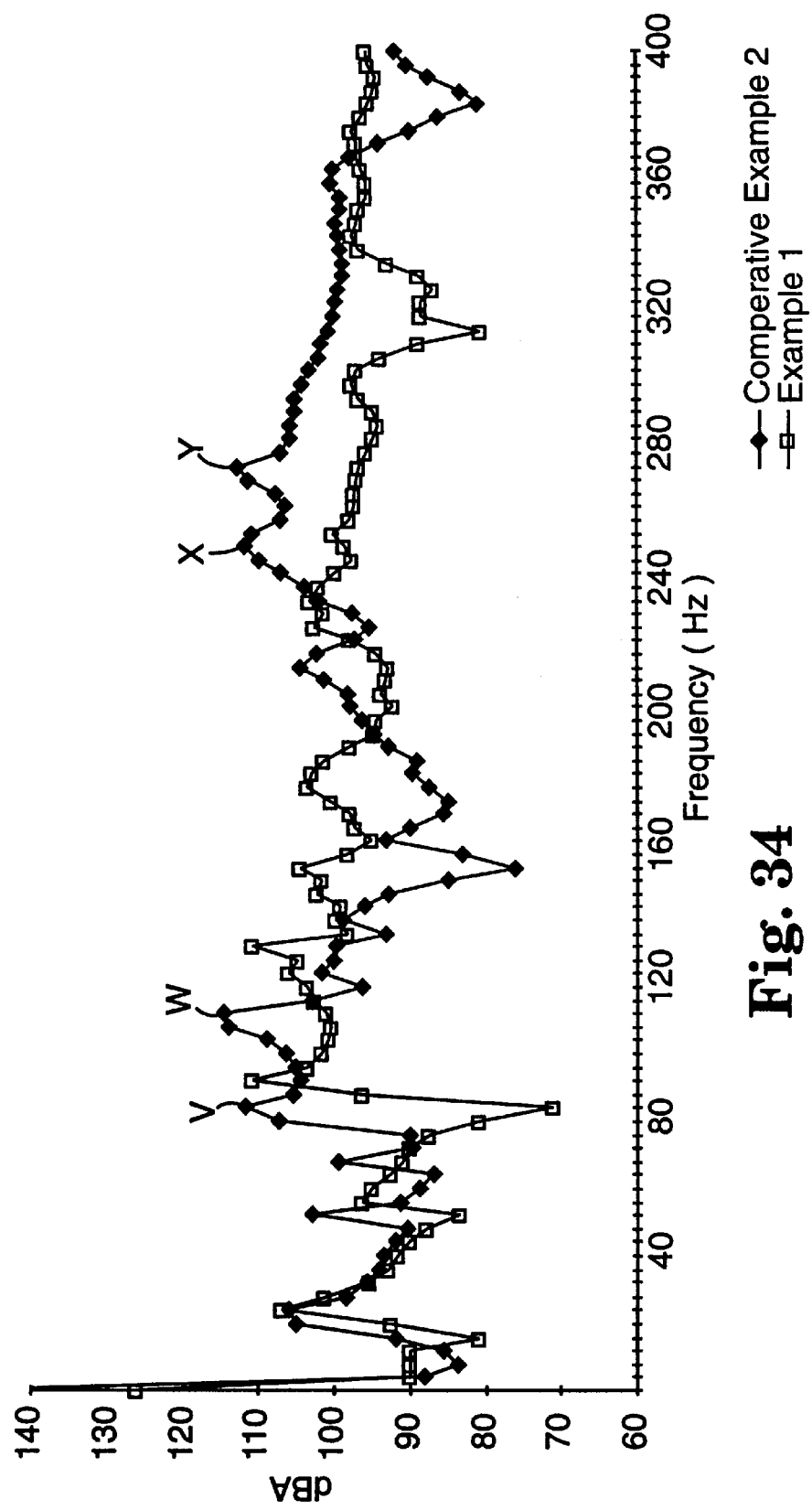
FIG. 34 is a graph illustrating frequency versus dB for the circuit boards of Comparative Example 2 and Example 1.

The graph in FIG. 34 shows that vibration damping and stiffening members add significant damping and stiffening to a circuit article (Example 1 of the present invention) as compared to an undamped circuit board free of stiffeners (Comparative Example 2). A reduction in amplitude is demonstrated by the circuit board of the present invention having the vibration damping and stiffening members attached (Example 1) as compared to the circuit board of Comparative Example 2 in the highest four peak amplitudes (V, W, X, and Y).

The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

I claim:

1. A damped and stiffened circuit article comprising:
   (a) a circuit article having at least one substantially flat surface;
   (b) a vibration damping and stiffening member(s) attached to at least one substantially flat surface of the circuit article, wherein each vibration damping and stiffening member independently comprises:
      (I) a constraining member, wherein the constraining member comprises:
         (i) a base, wherein the base has an upper surface, a lower surface, and at least one side; and
         (ii) at least one projection attached to and extending away from the base in a manner such that at least one of the following is true: (A) at least one projection is attached to and extends away from an upper surface of the base, (B) at least one projection is attached to and extends away from a lower surface of the base, (C) at least one projection is attached to and extends away from an upper surface of the base and at least one projection is attached to and extends away from a lower surface of the base;
      wherein the height of at least one projection is at least about 10% of the average thickness of the base; wherein the average thickness of the base of at least one vibration damping and stiffening member falls within the range of about 0.0254 to about 7.62 mm: wherein the width of the base of at least one vibration damping and stiffening member falls within the range of about 1.27 to about 76.2 mm; and wherein the height of at least one projection of at least one vibration damping and stiffening member ranges from about 0.0254 to about 76.2 mm;
      (II) a vibration damping material layer(s) comprising a viscoelastic material(s) wherein the vibration damping material layer(s) have a loss factor of at least about 0.01 and a Young's modulus of at least about $3\times10^3$ Pascals at 25 degrees C., wherein the vibration damping material layer(s) is bonded to at least a portion of the lower surface of the base;
      (III) optionally an intermediate connecting member attached to the vibration damping material layer(s) on a side opposite the constraining member, wherein the intermediate connecting member has a Young's modulus greater than the Young's modulus of the vibration damping material layer(s);
   wherein the constraining member has a Young's modulus greater than the Young's modulus of the vibration damping material layer(s);
   wherein the vibration damping and stiffening member(s) is attached to at least one substantially flat surface of the circuit article in a manner such that the circuit article is stiffened and vibrationally damped; and
   wherein about 0.005 to about 20 percent of the total area of the circuit article has vibration damping and stiffening member(s) attached thereto such that the damping of the circuit article is improved by at least about 10% in at least one vibrational mode compared to a same circuit article subjected to a same static or dynamic input without any vibration damping and stiffening members attached.

2. The damped and stiffened circuit article of claim 1 wherein the projection(s) extend from the base's upper surface of each vibration damping and stiffening member.

3. The damped and stiffened circuit article of claim 1 wherein about 0.05 to about 10 percent of the total surface area of the circuit article has vibration damping and stiffening member(s) attached thereto.

4. The damped and stiffened circuit article of claim 1 wherein one to six vibration damping and stiffening members are attached to a side of the circuit article.

5. The damped and stiffened circuit article of claim 1 wherein at least one vibration damping and stiffening member(s) spans about 50 to about 100 percent of a length, width, or diagonal of the circuit article surface.

6. The damped and stiffened circuit article of claim 1 wherein at least one vibration damping and stiffening member spans a distance of at least about 2 times a wavelength of a lowest mode desired to be damped.

7. The damped and stiffened circuit article of claim 1 wherein the vibration damping and stiffening member(s) are attached to the surface of the circuit article such that a flexural stiffness of the circuit article is at least about 1.5 times that of a same circuit article without the vibration damping and stiffening member(s) attached.

8. The damped and stiffened circuit article of claim 1 which has its static or dynamic deflection reduced by at least about 10%, compared to a same circuit article subjected to a same static or dynamic input without any vibration damping and stiffening members attached.

9. The vibration damped and stiffened circuit article of claim 1 wherein the vibration damping material layer(s) of each vibration damping and stiffening member have a thickness of less than 5.1 mm.

10. The vibration damped and stiffened circuit article of claim 1 wherein about 70 to 100% of the lower surface of the vibration damping and stiffening member(s) have its vibration damping material layer(s) in contact with the circuit article or an intermediate connecting member which in turn has about 70 to 100% of its lower surface in contact with the circuit article.

11. The vibration damped and stiffened circuit article of claim 1 wherein each vibration damping and stiffening member has a volume that is about 2–40% of a volume of a smallest rectangular box in which the vibration damping and stiffening member will fit.

12. The vibration damped and stiffened circuit article of claim 1 wherein the circuit article is a circuit board and wherein the temperature in degrees C. of an area of the circuit board is reduced by at least about 10 percent compared to a same area of a same circuit board but without the vibration damping and stiffening member(s) attached.

13. The vibration damped and stiffened circuit article of claim 1 wherein the constraining member of each vibration damping and stiffening member comprises a material selected from the group consisting of metals, glass, polymeric materials, epoxy laminates, carbon reinforced epoxy laminates, and combinations thereof.

14. The vibration damped and stiffened circuit article of claim 1 wherein the constraining member of at least one vibration damping and stiffening member comprises a laminate of two or more layers.

15. The damped and stiffened circuit article of claim 1 wherein a top view shape of at least one vibration damping and stiffening member is selected from the group consisting of polyhedron shapes, English alphabetic shapes, numerical shapes, plus sign shape, and minus sign shape.

16. The damped and stiffened circuit article of claim 1 wherein the projection(s) independently have shapes selected from the group consisting of geometric shapes, English alphabetic shapes, numerical shapes, plus sign shape, and minus sign shape.

17. The damped and stiffened circuit article of claim 1 wherein the projection(s) independently have shapes selected from the group consisting of geometric shapes selected from the group consisting of rectangular shapes and triangular shapes; English alphabetic shapes selected from the group consisting of "A", "K", "N", "X", "W", "R", "Y", "P", "F", "H", "E", "J", "V", "M", and angular "C" shapes; numerical shapes selected from the group consisting of 1 and 7; plus sign shape; and minus sign shapes.

18. The damped and stiffened circuit article of claim 1 wherein the constraining member of at least one vibration damping and stiffening member has a Young's modulus greater than about $1.37 \times 10^6$ Pascals.

19. The damped and stiffened circuit article of claim 1 wherein the average thickness of the base of at least one vibration damping and stiffening member falls within the range of about 0.127 to about 3.81 mm.

20. The damped and stiffened circuit article of claim 1 wherein the width of the base of at least one vibration damping and stiffening member falls within the range of about 2.54 to about 50.8 mm.

21. The damped and stiffened circuit article of claim 1 wherein the height of at least one projection of at least one vibration damping and stiffening member ranges from about 0.5–100 times the base's average thickness.

22. The damped and stiffened circuit article of claim 1 wherein the base thickness of the vibration damping and stiffening member(s) is constant.

23. The damped and stiffened circuit article of claim 1 wherein the vibration damping material layer(s) of at least one vibration damping and stiffening member have a loss factor of about 0.5 to about 10.

24. The damped and stiffened circuit article of claim 1 wherein the vibration damping material layer(s) of at least one vibration damping and stiffening member is selected from the group consisting of urethane rubbers, silicone rubbers, nitrile rubbers, butyl rubbers, acrylates, acrylic rubbers, natural rubbers, styrene-butadiene rubbers, polyesters, polyurethanes, polyamides, ethylene-vinyl acetate copolymers, polyvinyl butyral, polyvinyl butyral-polyvinyl acetate copolymers, epoxy-acrylate interpenetrating networks, and mixtures thereof.

25. The damped and stiffened circuit article of claim 1 wherein the vibration damping material layer(s) of at least one vibration damping and stiffening member further comprises about 3–60 wt. % of a fibrous material based on the total weight of the vibration damping material.

26. The damped and stiffened circuit article of claim 1 wherein the vibration damping material layer(s) of at least one vibration damping and stiffening member further comprises about 0.5–70 wt. % of a particulate material based on the total weight of the vibration damping material.

27. The damped and stiffened circuit article of claim 1 wherein at least one vibration damping and stiffening member comprises an intermediate connecting member.

28. The damped and stiffened circuit article of claim 27 wherein the intermediate connecting member comprises a material selected from the group consisting of syntactic foam, fiber reinforced epoxy material, particulate reinforced epoxy material, polycarbonate, polysulfone, polyester, polyimide, stainless steel, and aluminum.

29. The damped and stiffened circuit article of claim 27 wherein the intermediate connecting member of at least one vibration damping and stiffening member has a length and width at least as great as the length and width of the constraining member and vibration damping material layer (s) of the vibration damping and stiffening member.

30. The damped and stiffened circuit article of claim 27 wherein the intermediate connecting member is attached to the circuit article via adhesive.

31. The damped and stiffened circuit article of claim 1 wherein the intermediate connecting member has an average thickness of about 0.12 to about 25 mm.

32. The damped and stiffened circuit article of claim 1 wherein for the vibration damping material layer(s) of at least one vibration damping and stiffening member the total amount of chlorides, silicones, acids, bases, alcohols, solvents, esters, amides, amines, extractable hydrocarbons, organotin compounds, tin compounds, and catalysts is less than 3000 ppm.

33. The damped and stiffened circuit article of claim 1 wherein the vibration damping material has an adhesion of at least about 13,788 Pascals for a 180 degree peel test, with a 30 cm/minute peel rate with a 0.0254 mm stainless steel test backing from the circuit article surface.

34. The damped and stiffened circuit article of claim 1 wherein at least one vibration damping and stiffening member has one or more of the following: cut-outs, notches, slits, bends, embossing, coining, folds, flaps, curves, and steps.

35. The damped and stiffened circuit article of claim 1 wherein for at least one vibration damping and stiffening member, the base and the at least one projection comprise different materials, and the base and the projection(s) are attached via a method selected from the group consisting of adhesive, injection molding, heat welding, and sonic welding.

* * * * *